United States Patent
Heijden et al.

(10) Patent No.: US 8,174,322 B2
(45) Date of Patent: May 8, 2012

(54) POWER CONTROL OF RECONFIGURABLE OUTPHASING CHIREIX AMPLIFIERS AND METHODS

(75) Inventors: Mark van der Heijden, Eindhoven (NL); Mustafa Acar, Eindhoven (NL); Jan Sophia Vromans, Maastricht (NL); Melina Apostolidou, Enschede (NL)

(73) Assignee: NXP B.V. (NL)

(*) Notice: Subject to any disclaimer, the term of this patent is extended or adjusted under 35 U.S.C. 154(b) by 0 days.

(21) Appl. No.: 13/052,722

(22) Filed: Mar. 21, 2011

(65) Prior Publication Data
US 2011/0273236 A1    Nov. 10, 2011

Related U.S. Application Data

(63) Continuation-in-part of application No. 12/773,498, filed on May 4, 2010.

(51) Int. Cl.
*H03F 3/68* (2006.01)

(52) U.S. Cl. ............... 330/295; 330/124 R; 330/302

(58) Field of Classification Search ......... 330/124 R, 330/295, 302
See application file for complete search history.

(56) References Cited

U.S. PATENT DOCUMENTS

| | | | | |
|---|---|---|---|---|
| 6,133,788 A * | 10/2000 | Dent | ................ | 330/124 R |
| 6,285,251 B1 | 9/2001 | Dent et al. | | |
| 7,119,623 B2 | 10/2006 | Blednov et al. | | |
| 7,151,407 B2 * | 12/2006 | Grundlingh | ................ | 330/251 |
| 7,714,649 B1 | 5/2010 | Cripe | | |
| 7,729,445 B2 * | 6/2010 | Ravi et al. | ................ | 375/297 |
| 7,893,762 B2 * | 2/2011 | Hellberg et al. | ................ | 330/124 R |
| 2004/0075492 A1 | 4/2004 | Wight | | |
| 2004/0185805 A1 | 9/2004 | Kim et al. | | |
| 2007/0205828 A1 | 9/2007 | Grundlingh | | |

FOREIGN PATENT DOCUMENTS

| | | |
|---|---|---|
| EP | 1881597 A1 | 1/2008 |
| WO | 2008067054 A1 | 5/2009 |
| WO | 2009/136326 A1 | 11/2009 |
| WO | 2010041181 A1 | 4/2010 |

OTHER PUBLICATIONS

H. Chireix, "High Power Out Phasing Modulation", Proc. IRE, vol. 23, No. 11, pp. 1370-1392, Nov. 1935.
M.P. van der Heijden et al, "Switch-Mode PA Concept for Cellular Base Station Transmitters", NXP-R-TN 2009/0026, Mar. 2009.

(Continued)

*Primary Examiner* — Patricia Nguyen
(74) *Attorney, Agent, or Firm* — Kramer & Amado P.C.

(57) ABSTRACT

Various embodiments relate to a reconfigurable integrated digital Chireix out-phasing power amplifier for use in high power base stations is described and a related method of said design. The power amplifier may include a power transistor circuitry having plurality of power transistors and shunt-series circuitry ($L_1C_1$, $L_2C_2$), a broadband combiner having Chireix compensation elements, and an impedance matching filter. In one embodiment, the power amplifier is implemented in a real switch-mode to facilitate integration of the Chireix compensation elements so as to make the Chireix power amplifier tunable. A method of driving Chireix power amplifier structure is also described. In some embodiments, a variable supply voltage may power the transistor circuitry based on the desired output power of the Chireix power amplifier. In some embodiments, the variable supply voltage may depend upon an out-phasing angle between the two drivers in the transistor circuitry.

20 Claims, 19 Drawing Sheets

OTHER PUBLICATIONS

K. Tom et al, "Load-Pull Analysis of Outphasing Class-E Power Amplifier", Proc, AusWireless, pp. 52-55, Aug. 2007.

R. Beltran et al, "HF Outphasing Transmitter Using Class-E Power Amplifiers", IEEE MTT-S Digest, pp. 757-760, Jun. 2009.

L.K. Nanver et al, "Improved RF Devices for Future Adaptive Wireless Systems Using Two-Sided Contacting and AlN Cooling", IEEE J. of Solid-State Circuits, vol. 44, No. 9, pp. 2322-2338, Sep. 2009.

Sungwon Chung et al, "Asymmetric Multilevel Outphasing Architecture for Multi-Standard Transmitters", Radio Frequency Integrated Circuits Symposium, 2009, pp. 237-240.

Sungwon Chung et al, "Asymmetric Multilevel Outphasing Transmitter Using Class-E PAs with Discrete Pulse Width Modulation", Microwave Symposium Digest (MTT), 2010, pp. 264-267.

Kai-Yuan Jheng et al, "Multilevel LINC System Designs for Power Efficiency Enhancement of Transmitters", IEEE Journal of Selected Topics in Signal Processing, vol. 3. No. 3, 2009, pp. 523-532.

Yonghoon Song et al., "A CMOS Class-E Power Amplifier With Voltage Stress Relief and Enhanced Efficiency", IEEE Transactions on Microwave Theory and Techniques, vol. 58, No. 2, 2010, pp. 310-317.

European Search Report dated Oct. 21, 2011 for Corresponding European Application No. 11164673.3.

* cited by examiner

POWER CONTROL OF RECONFIGURABLE OUTPHASING CHIREIX AMPLIFIERS AND METHODS

CROSS REFERENCE TO RELATED APPLICATIONS

This application is a continuation-in-part of U.S. patent application Ser. No. 12/773,498 which was filed on May 4, 2010 and entitled RECONFIGURABLE OUTPHASING CHIREIX AMPLIFIERS AND METHODS. This application is herein incorporated by reference for all that it contains.

TECHNICAL FIELD

Various exemplary embodiments disclosed herein relate generally to power amplifiers. More specifically, they relate to integrated Chireix out-phasing power amplifiers and methods.

BACKGROUND

Power amplifiers are widely used in communication systems, for example in cellular communication systems and cellular base stations wherein high frequency communication signals are amplified for transmission.

Bandwidth and efficiency are important considerations in the design of power amplifiers. In the context of cellular base stations, there is a growing need for improved power amplifier (PA) efficiency. There is also need for reconfigurable cellular base station transmitters due to the growing number of standards and the need for backward compatibility without compromising the overall power amplifier efficiency and linearity. A conventional power amplifier, such as a class-B amplifier, generally provides maximum efficiency at or near its maximum saturated power output level. In order to accurately reproduce a signal of varying amplitude, the peak output signal level should be equal to or less than that maximum saturated power level. When the instantaneous signal output level is less than the peak output level, a conventional class-B power amplifier generally operates at less than maximum efficiency.

More recent cellular communication standards, such as UMTS (Universal Mobile Telecommunication Standard) and LTE (Long-Term Evolution) created within 3GPP ($3^{rd}$ Generation Partnership Project), use complex modulation schemes whose amplitude component creates large variations in the instantaneous carrier output power of a transmitter. The ratio of the peak carrier output power to the average output power (defined as the "crest factor") when expressed in decibels (dB), may reach values on the order of 10 dB. With crest factors of such magnitude, efficiency of a base-station power amplifier is severely reduced; in order to be able to process large peak carrier powers, a conventional, linear PA operates several dB below its maximum output power capability (e.g., several dB into back-off) for most of its operational time.

Various approaches have been proposed to address the issue noted above. In one approach, a modified out-phasing technique by Chireix (sold under the brand name "Ampliphase" by RCA) has been proposed. The term "out-phasing" relates to a method of obtaining amplitude modulation (AM) by combining several (generally two) phase-modulated constant-amplitude signals, as further described below. These signals are produced in a "signal component separator" (SCS) and subsequently, after up-conversion and amplification through RF chains (mixers filters and amplifiers), combined to form an amplified linear signal within an output combiner network. The phases of these constant-amplitude signals are chosen so that the result from their vector-summation yields the desired amplitude, as the amplitude modulation is achieved by the degree of addition or subtraction due to the phase difference between the two signals.

In the Chireix approach, as noted above, a low-level copy of an intended output signal is resolved into two equal-amplitude components with a phase separation determined by the instantaneous amplitude of the intended output signal. These two equal-amplitude components are then amplified by a pair of RF power amplifiers operating in saturation or switched-mode for optimum power efficiency. The outputs of both the power amplifiers are then combined in a low-loss Chireix combiner so as to re-construct a fully-modulated RF carrier. By so doing, effectively, the resistive load impedance that is seen by both PAs becomes a function of the output phase angle and results in an envelope modulation of the output power expressed as:

$$|P_{OUT}(t)| \propto \frac{V_{DD}^2}{2R(\theta(t))} \propto \frac{V_{DD}^2}{2R_L}\cos^2(\theta(t)) \tag{1}$$

In the Chireix approach described above, benefits are derived from the use of switched-mode rather than linear-mode power amplifiers.

Conventional Chireix out-phasing PA has drawbacks in terms of bandwidth and efficiency. Frequency limitations are imposed by power combiner (e.g., quarter wavelength transmission lines) and fixed susceptance compensation elements ($\pm jB_C$, as discussed below). Another drawback in the conventional Chireix PA is that it is usually built from saturated linear PAs (e.g., class AB) or harmonically tuned PAs (e.g., class-F), which ideally fail to provide 100% efficiency without making use of harmonic traps in a matching network.

Other approaches based on class-E and other switch mode (e.g., class DE) based out-phasing have other deficiencies, as they have failed to consider integration, reported to have wide RF bandwidth, and failed to account for reconfigurability aspects. Further, other approaches, like the n-way Doherty PA, in general require more tunable elements due to the use of several quarter-wave transmissions lines.

SUMMARY

In light of the present need for communications networks having base stations with enhanced power amplifier efficiency and reconfigurability, a brief summary of various exemplary embodiments is presented. Some simplifications and omissions may be made in the following summary, which is intended to highlight and introduce some aspects of the various exemplary embodiments, but not to limit the scope of the embodiments. Detailed descriptions of a preferred exemplary embodiment adequate to allow those of ordinary skill in the art to make and use the inventive concepts will follow in later sections.

In one aspect, an integrated digital Chireix power amplifier device may comprise power transistor circuitry comprising a plurality of power transistors receiving a variable supply voltage and a shunt-series circuit, wherein the power transistor circuit produces an output power proportional to the variable supply voltage. The integrated Chireix power amplifier device may also comprise a broadband combiner having Chireix compensation elements, and an impedance matching filter, wherein the power transistor circuitry, the broadband combiner, and the impedance matching filter are arranged to be integrated in a unified package.

In another aspect, a cellular base station terminal having a digital Chireix power amplifier structure is disclosed.

In a further aspect, a method of driving a Chireix power amplifier structure is disclosed. The method includes providing power transistor circuitry comprising a plurality of power transistors receiving a variable supply voltage and a shunt-series circuit, wherein the power transistor circuit produces an output power proportional to the variable supply voltage. The method may also comprise providing a broadband combiner having Chireix compensation elements, and an impedance matching filter in a unified package. The method may also include tuning a shunt-series network so as to enable reconfiguring of the power amplifier structure. The method may also include driving the power transistor circuitry in a real switch-mode.

BRIEF DESCRIPTION OF THE DRAWINGS

In order to better understand various exemplary embodiments, reference is made to the accompanying drawings, wherein.

DETAILED DESCRIPTION

Figure 1A:
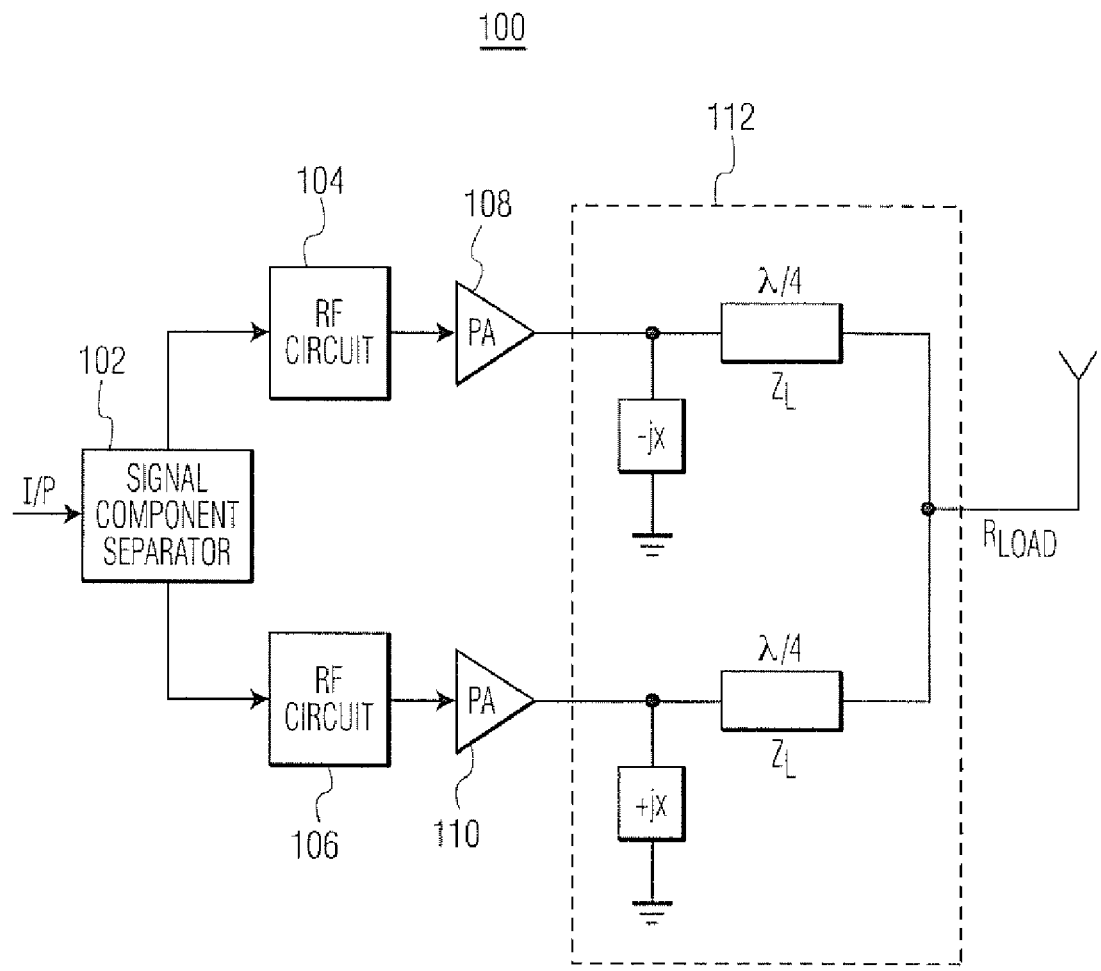
FIG. 1A is a block diagram of a conventional Chireix amplifier.

Referring now to the drawings, in which like numerals refer to like components or steps, there are disclosed broad aspects of various exemplary embodiments.

FIG. 1A is a block diagram of a conventional Chireix amplifier 100. In regards to Chireix amplifiers, out-phasing is defined as a method of obtaining amplitude modulation (AM) by combining two phase-modulated constant-amplitude signals in a signal component separator 102. The separate signal components may be upconverted in RF circuits 104, 106 and amplified using power amplifiers 108, 110. The out-phased signals may then be combined to form an amplified linear signal in a Chireix-type output network 112. The phases of the constant-amplitude out-phased signals are chosen such that the result from their vector-sum produces the desired amplitude. The Chireix output network 112 may include two quarter-wave lines λ/4 (where λ is the wavelength of the center frequency of the frequency band at which the amplifier is operated) and two compensating reactances, +jX and −jX, which are used to extend the region of high efficiency to include lower output-power levels.

Figure 1B:
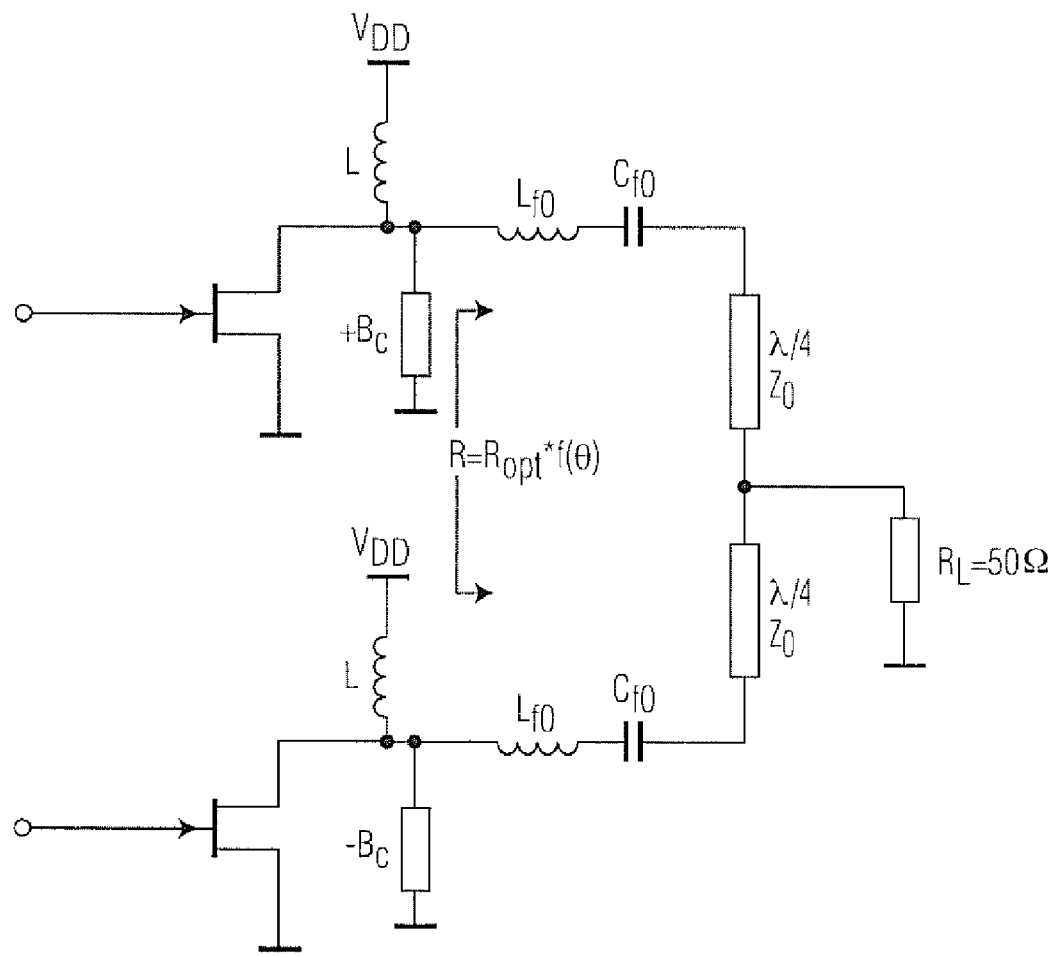
FIG. 1B shows a conventional switched-mode, Class-E out-phasing PA with a Chireix combiner topology.

FIG. 1B shows a conventional switched-mode, Class-E out-phasing PA with a Chireix combiner topology. The class-E PA that may be using at high frequencies, where the switching time is comparable to the duty cycle of the power transistors. The following design equations are applicable for the topology shown in FIG. 1B:

$$R = \frac{z_0^2}{2R_L} \cdot \frac{1}{\cos^2\theta} = R_{OPT} \cdot \frac{1}{\cos^2\theta} \quad (2)$$

$$B_C = \frac{R_L}{Z_0^2}\sin(2\theta_C) = \frac{1}{2R_{OPT}}\sin(2\theta_C) \quad (3)$$

$$\theta_C = \arcsin(10^{-BO/20}) \quad (4)$$

where $R_{OPT}$ is the optimum class-E load resistance, $B_C$ is the Chireix compensation element, and $\theta_C$ is the Chireix compensation angle where we ideally require 100% efficiency for a specific back-off power level with respect to the peak power.

Figure 2:
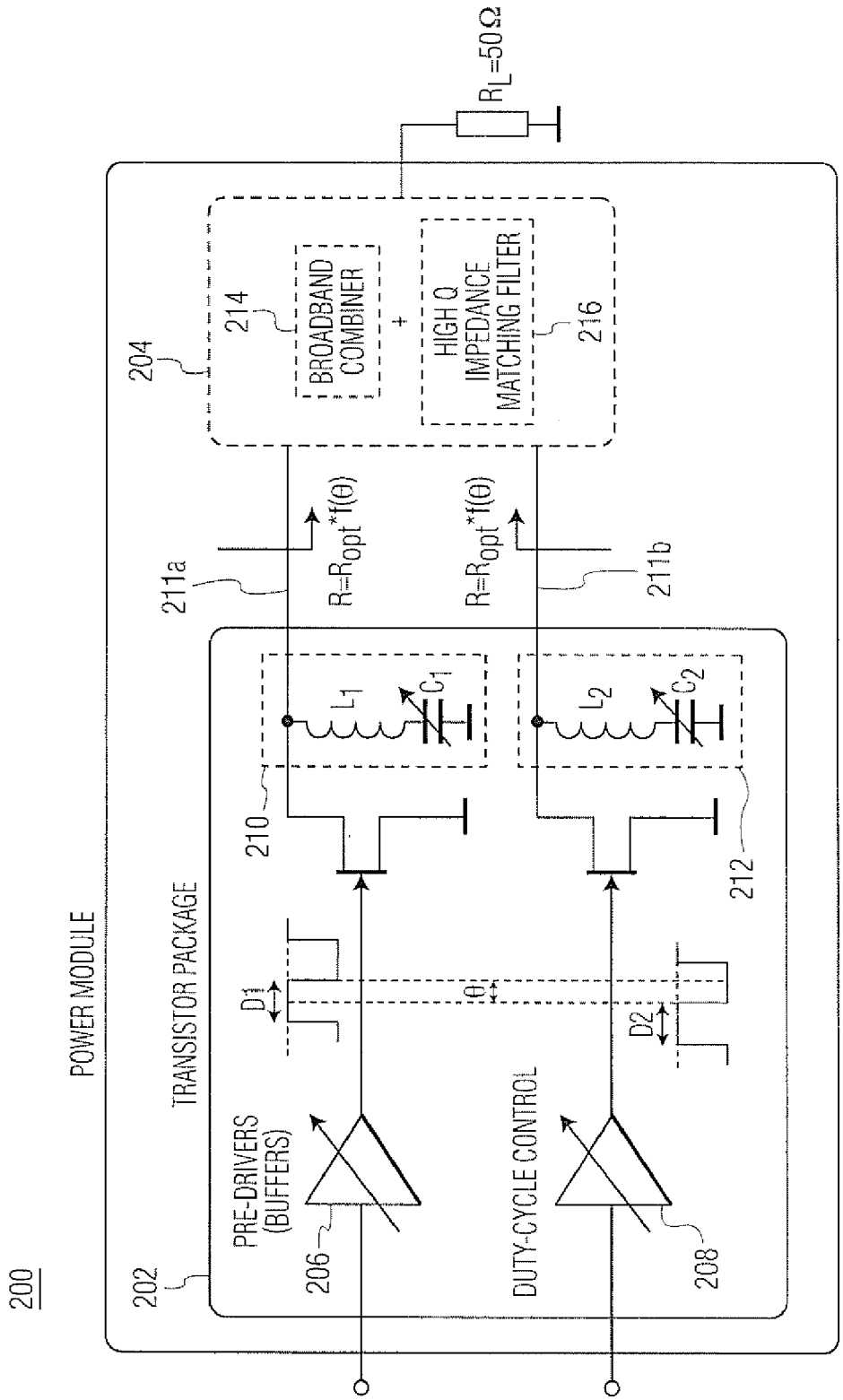
FIG. 2 shows a schematic diagram of an out-phasing power amplifier with variable shunt inductor, a broadband combiner, and a matching network.

FIG. 2 illustrates a schematic diagram of an out-phasing power amplifier 200 in accordance with an embodiment. In one exemplary embodiment, the power amplifier (PA) 200 is a duty-cycle controlled, switch-mode out-phasing power amplifier. The PA 200 may include a variable shunt inductor, a broadband (e.g., wideband) combiner and a matching network. The power amplifier 200 may include transistor circuitry 202 and broadband combiner circuitry 204. The transistor circuitry 202 may include pre-driver components 206, 208 and shunt inductance circuitry 210, 212.

The transistor circuitry 202 may comprise, for example, a CMOS driver connected to a Gallium Nitride (GaN) power transistor. A person of skill in the art would be knowledgeable of other combinations, such as a CMOS driver with a laterally-diffused metal oxide semiconductor (LDMOS) power transistor, or BiCMOS driver with GaN power transistor.

The broadband combiner circuitry 204 may include broadband combiner 214 and high-quality impedance matching filter circuit 216. In some embodiments, the PA 200 may operate with the power transistors 202 operating at a constant duty cycle, e.g., D=0.5 (50%).

Exemplary features in accordance with various embodiments, one of which is shown in FIG. 2, include for example, utilization of a finite, shunt-inductance class-E PA that operates at the optimum class-E mode for a given load modulation. This operating mode ($q=1/(\omega\sqrt{LC_{DS}})\approx 1.3$ at a 50% duty cycle, where q is the quality factor of the LC circuit) enables the class-E PA to maintain 100% efficiency across a wide dynamic range of output powers when R is changing. This feature makes it a desired class-E candidate for systems based on load-modulation, such as, for example, dynamic load modulation or out-phasing, such as in Chireix PAs, where high efficiency across a wide dynamic range is desired.

Additional features of the PA 200 are the integrated power transistors. The integrated power transistors of the transistor circuit 202, along with the shunt inductors 210, 212 in a unified package may use the "inshin" technique, as described U.S. Pat. No. 7,119,623 (assigned to the present assignee), the entire contents of which are incorporated herein by reference. The shunt inductors 210, 212 may facilitate establishing a desired class-E operation mode and also desired Chireix compensation-per-power transistor.

During regular configuration and operation, a reconfigurable Chireix out-phasing power amplifier may be established by means of varying the effective shunt inductance, which may require, for example, varactors (i.e., variable-capacitance diodes) or switched capacitor banks. The modulation of the at least one varactor may be used for analog tuning, whereas the switched capacitor banks may be used for digital tuning. In some embodiments, both analog and digital tuning of the Chireix PA may be implemented simultaneously. In some embodiments, the reconfigurable Chireix out-phasing PA may be established with static inductors and capacitors, and a modifiable duty cycle of the switch power transistors.

The broadband combiner 214 of the combiner circuitry 204 may be implemented by a Marchand balun, its low-frequency equivalent, or a transformer-based combiner.

In some embodiments, the element values of the shunt series networks at the output of both PA branches 211A, 211B can be calculated from the equations below:

$$L_{1,OPT} = \frac{L}{1 + \omega \cdot L \cdot B_C} \quad (5)$$

$$L_{2,OPT} = \frac{L}{1 - \omega \cdot L \cdot B_C}$$

$$L = \frac{1}{\omega^2 q^2 C_{DS}} \quad (6)$$

$$C_1(\omega) = \frac{1}{\omega^2(L_1 - L_{1,OPT})} = \frac{1}{\omega\left(\omega L_1 - \frac{1}{q^2 \omega C_{DS} + B_C}\right)} \quad (7)$$

$$C_2(\omega) = \frac{1}{\omega^2(L_2 - L_{2,OPT})} = \frac{1}{\omega\left(\omega L_2 - \frac{1}{q^2 \omega C_{DS} - B_C}\right)}$$

$$L_1 > \frac{1}{q^2 \omega C_{DS} + B_C} \quad (8)$$

$$L_2 > \frac{1}{q^2 \omega C_{DS} - B_C}$$

where the quality factor q is ideally 1.3 for load modulation, $C_{DS}$ is the output capacitance of the transistor, $\omega$ is the operational frequency, and the Chireix compensation element $B_C$ is given by (3).

For example, if a complex-modulated signal (e.g. WCDMA or LTE) has a crest factor of 10 dB, it may be preferred that the second efficiency peak of the complex-modulated signal have a magnitude approximately equal to the 10 dB back-off. In this embodiment, $L_1$ and $L_2$ may be fixed, shunt-drain inductors, which may have to fulfill at least equation (8). In order to maintain the optimum class-E operating mode ($q \approx 1.3$) and Chireix compensation for frequencies other than the design frequency $f_0$ (aiming at reconfigurable PAs), the values of $C_1$ and $C_2$ in 210, 212 may be changed in accordance with equation (7). The values of $C_1$ and $C_2$ may be modified using analog tuning with varactors, or using digital tuning with switched capacitor banks. The tuning settings for the capacitors $C_1$ and $C_2$ may be stored in a table and may be set by a digital "word" when installing a base station amplifier (not shown).

In another embodiment, fixed $L_1$ and $L_2$ values, with or without series capacitors $C_1$ and $C_2$ in shunt inductors 210, 212, may be chosen, while duty cycles $D_1$ and $D_2$ may be modified digitally to effectively change the quality factor q to compensate for a change in frequency $\omega$ without needing to change the component values calculated in equation (3) and equation (6) at the nominal design frequency.

In an exemplary embodiment, Table 1 lists the optimum element values for the power amplifier 200, when assuming a device output capacitance $C_{DS}=1$ pF and a back-off level of 13 dB.

TABLE 1

Out-phasing class-E PA component values ($C_{DS}$ = 1 pF, BO = 13 dB, $D_1 = D_2 = 0.5$)

| $f_0$ (GHz) | q | $C_1$ (pF) | $C_2$ (pF) | $L_1$ (nH) | $L_2$ (nH) | L (nH) | $B_C$ (S) | $R_{OPT}$ (Ω) |
|---|---|---|---|---|---|---|---|---|
| 2.1 | 1.3 | 4.17 | 2.82 | 4.3 | 6.1 | 3.40 | 3.64 m | 60 |
| 2.4 | 1.3 | 2.17 | 1.43 | 4.3 | 6.1 | 2.60 | 3.64 m | 60 |
| 2.7 | 1.3 | 1.41 | 0.93 | 4.3 | 6.1 | 2.06 | 3.64 m | 60 |

Figure 3A:
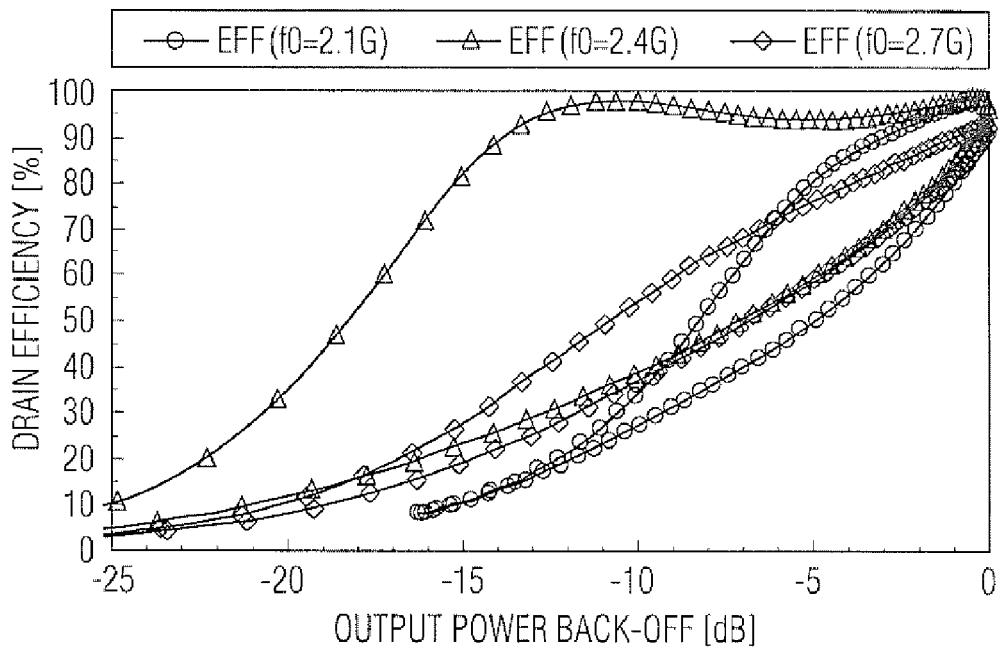
FIG. 3(a) is a diagram illustrating efficiency as a function of normalized output power in dB for the power amplifier shown in FIG. 2 and for a Chireix compensation of 13 dB output power back-off without compensation.

FIG. 3A is a diagram illustrating simulated power efficiency, in one example, as a function of normalized output power in dB for the power amplifier 200 shown in FIG. 2 and for a Chireix compensation of 13 dB output power back-off without compensation. Results depicted in FIG. 3A illustrate that by not fulfilling the quality factor q=1.3 (as shown in Table 1) at all frequencies, certain efficiency may be compromised.

Figure 3B:
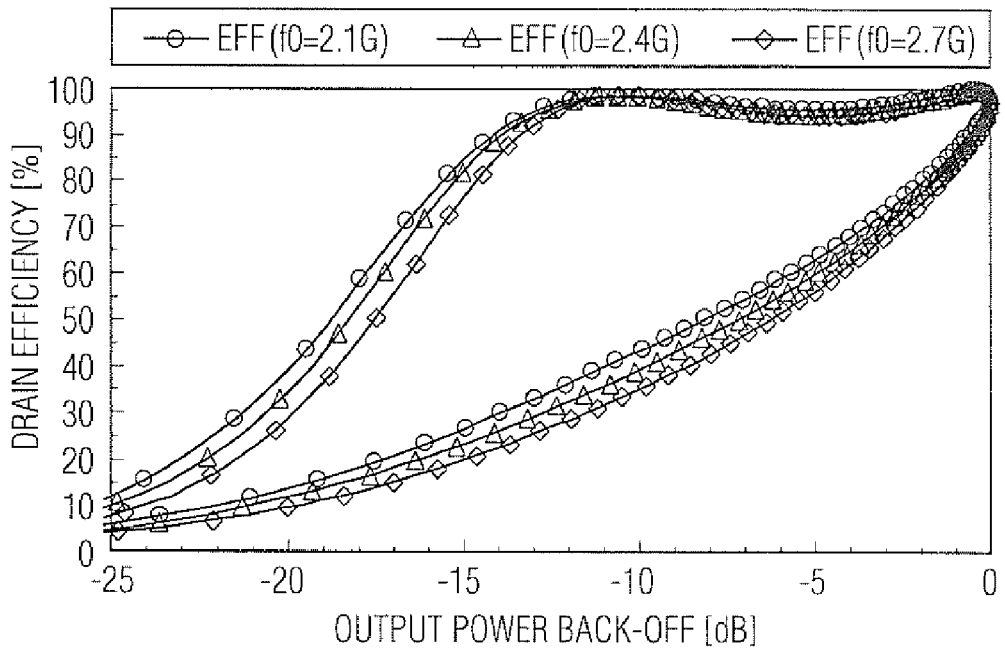
FIG. 3(b) is a diagram illustrating efficiency as a function of normalized output power in dB for the power amplifier shown in FIG. 2 and for a Chireix compensation of 13 dB output power back-off with compensation by adapting capacitances in accordance with information provided in Table 1 at band-edge frequencies.

FIG. 3B is a diagram illustrating simulated power efficiency, in one example, as a function of normalized output power in dB for the power amplifier 200 shown in FIG. 2 and for a Chireix compensation of 13 dB output power back-off with compensation by adapting capacitances in accordance with information provided in Table 1 at band-edge frequencies. Results depicted in FIG. 3B illustrate that efficiency can be recovered at all frequencies when the effective shunt L of the individual class-E PA branches 211A and 211B are configured in accordance with equation (7).

In another embodiment, a fixed, rather than a tunable, Chireix combiner network may be used, wherein the power amplifier 200 may be reconfigured for different frequency bands by varying the duty cycle. In such an embodiment, changing the duty cycle has a similar effect in reconfiguring the PA as changing the effective shunt inductance L and output capacitance $C_{DS}$ series in shunt inductors 210, 212. In the example embodiment described in relation to FIG. 2, this may occur when a different quality factor q exists for a duty-cycle other than $D_1=D_2=0.5$ (50%). To compensate for a change in frequency, the duty cycle may be changed, without reconfiguring the components in the matching network in accordance with equations (3) and (6) for the new operational frequency. Using the fixed components, the duty cycle may be changed to modulate the quality factor q until a new optimum value is found for the new operational frequency.

In an exemplary case, Table 2 shows component values for the power amplifier 200 of FIG. 2 when a range of frequencies is required. Specifically, Table 2 lists optimum duty-cycle combinations for frequencies $f_0$=2.1, 2.4, and 2.7 GHz. The starting point for the design are again the nominal component values of a Chireix combiner optimized at design frequency $f_0$=2.4 GHz.

TABLE 2

Out-phasing class-E PA component values ($C_{DS}$ = 1 pF, BO = 13 dB, $C_1$ = 2.17 pF, $C_2$ = 1.43 pF)

| $f_0$ (GHz) | q | $D_1$ (pF) | $D_2$ (pF) | $L_1$ (nH) | $L_2$ (nH) | L (nH) | $B_C$ (S) | $R_{OPT}$ (Ω) |
|---|---|---|---|---|---|---|---|---|
| 2.1 | 1.50 | 0.58 | 0.60 | 4.3 | 6.1 | 2.60 | 3.64 m | 60 |
| 2.4 | 1.30 | 0.50 | 0.50 | 4.3 | 6.1 | 2.60 | 3.64 m | 60 |
| 2.7 | 1.15 | 0.37 | 0.40 | 4.3 | 6.1 | 2.60 | 3.64 m | 60 |

Figure 4:
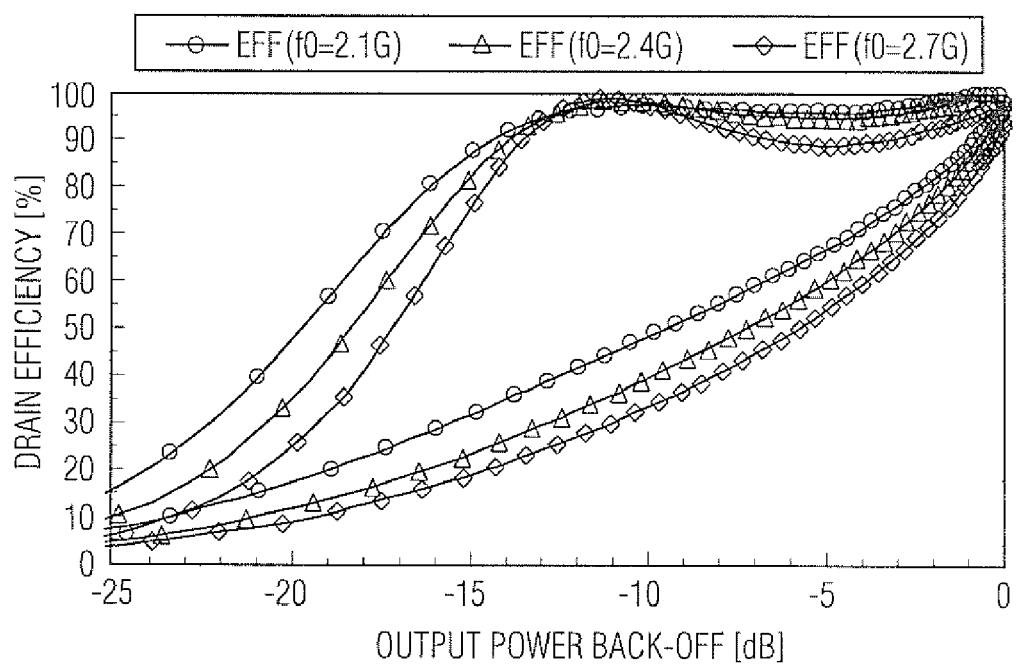
FIG. 4 is a diagram illustrating efficiency as a function of normalized output power in dB for the power amplifier shown in FIG. 2 and for a Chireix compensation of 13 dB output power back-off using duty-cycle control at band-edge frequencies in accordance with information provided in Table 2.

FIG. 4 is an exemplary diagram illustrating drain efficiency as a function of normalized output power in dB for a fixed power amplifier shown in FIG. 2 and for a Chireix compensation of 13 dB output power back-off using duty-cycle control at band-edge frequencies in accordance with information provided in Table 2. Specifically, the FIG. 4 plot shows efficiency versus output power back-off at 2.1 GHz, 2.4 GHz, and 2.7 GHz when duty-cycle control is applied to recover the efficiency performance at 2.1 GHz and 2.7 GHz. In such instances, efficiency may be recovered over more than a 10 dB dynamic range over the whole frequency range by only changing the duty cycle. Comparing this result with results obtained with control of variable series capacitors, the exemplary duty-cycle control results in a slightly larger spread of the efficiency curves outside the Chireix compensation levels. As will be discussed below in relation to FIGS. 14-15, the inventors have discovered through simulation, that when duty-cycle control is applied, the supply voltage $V_{DD}$ may be adapted and modified as well to accommodate for the changing output power levels caused by the change in the switch duty cycle for different frequencies.

Figure 5:
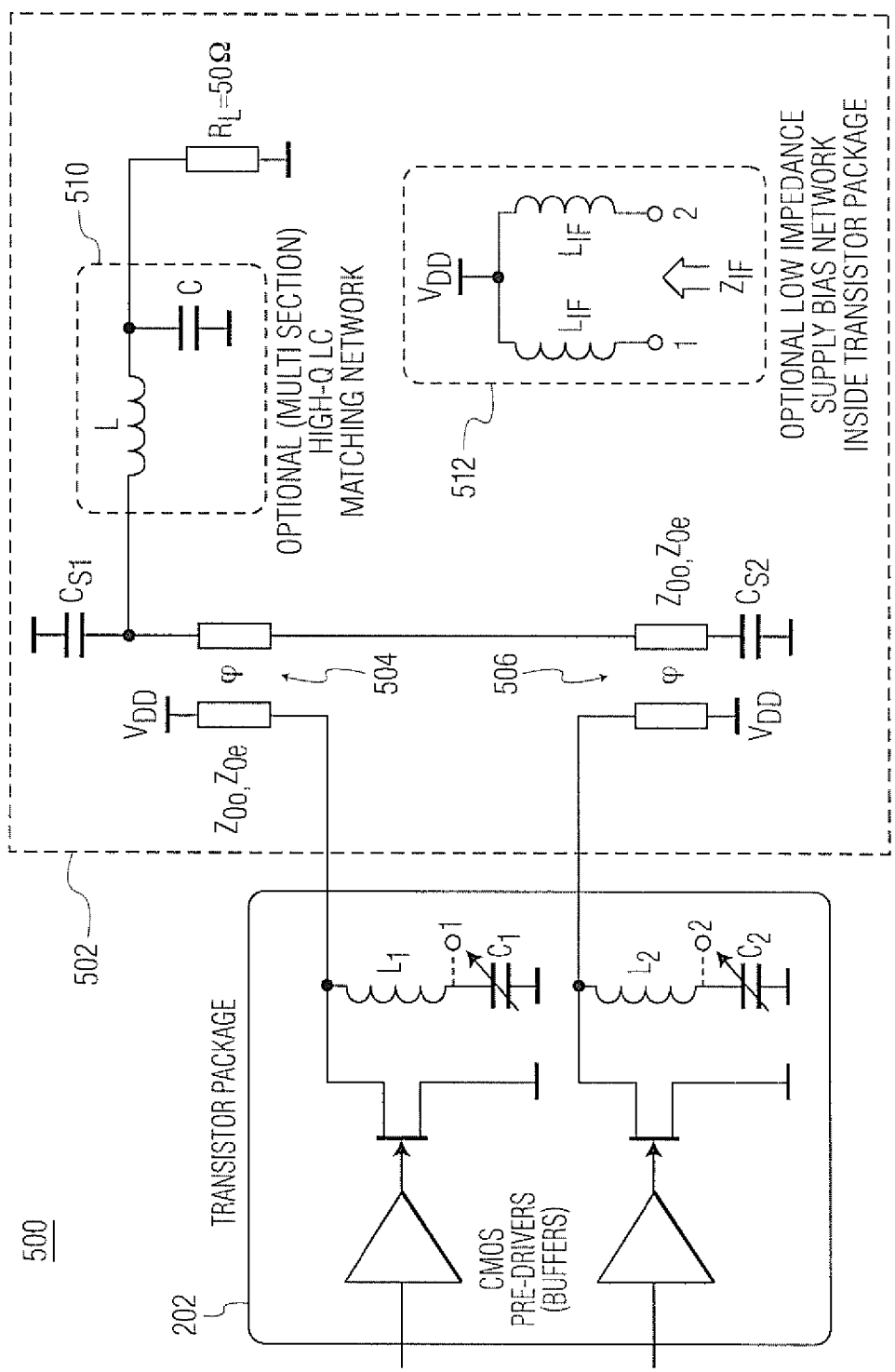
FIG. 5 shows a schematic diagram of an out-phasing power amplifier with variable shunt inductor, a broadband combiner, and a matching network in accordance with an embodiment.

FIG. 5 shows a schematic diagram of an out-phasing power amplifier of FIG. 2, disclosing a specific implementation of the broadband combiner circuit 204 in accordance with one embodiment. The power amplifier 500 may include a transistor circuit 202 and a broadband combiner circuit 502. Details of transistor circuit 202 may be similar to the transistor circuit 202 in FIG. 2. The broadband combiner circuit 502 may include transmission-line components 504, 506, LC matching network 510, and an optional low-impedance supply bias network 512. In some embodiments, the supply-bias network 512 may be provided inside the transistor circuit 202. In the context of this disclosure, a balun can be a passive electronic circuit for converting between "balanced" (balanced about ground) and "unbalanced" (i.e., single-ended) electrical signals.

In the embodiment shown in FIG. 5, the broadband combiner circuit 502 may be a BALUN, which may be implemented with a miniaturized Marchand balun ($\phi$<<90 degrees) that may require tight coupling between individual transmission lines, and preferably, may be implemented by broadside coupled lines in a 3-layer substrate (e.g., S-S-GND). In some embodiments, the tight coupling may be in the form of a high mutual capacitance or inductance between the lines, where energy is transferred by the capacitance and/or inductance between the two transmission lines. The broadband combiner circuit 502 may be designed to provide a constant, real impedance level across the bandwidth of interest (e.g., a Butterworth type). The optional bias network 512 (e.g., low-pass LC filter) may provide additional impedance matching and may also enable the establishment of the required loaded quality factor for class-E operation.

A feature in accordance with the various embodiments may be the integration of tunable shunt-series networks 210, 212 (FIG. 2) in a unified power amplifier device or package 200, as shown in FIG. 2. The tunable shunt-series networks 201, 212 may be combined with any of the broadband combiners shown, in accordance with various embodiments.

Figure 6A:
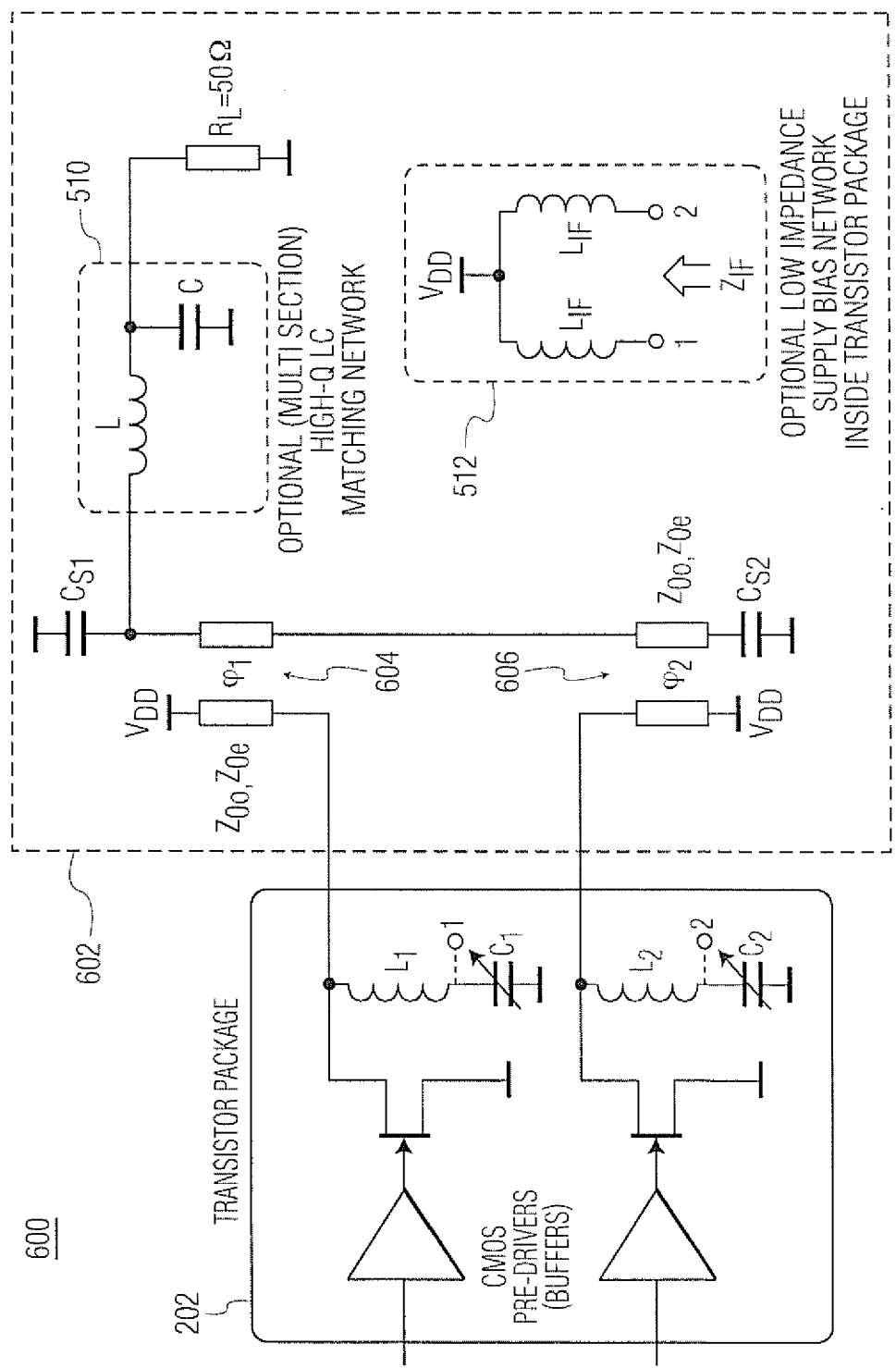
FIGS. 6A and 6B show a schematic diagram of an out-phasing power amplifier with variable shunt inductor, a broadband combiner, and a matching network in accordance with another embodiment.
Figure 6B:
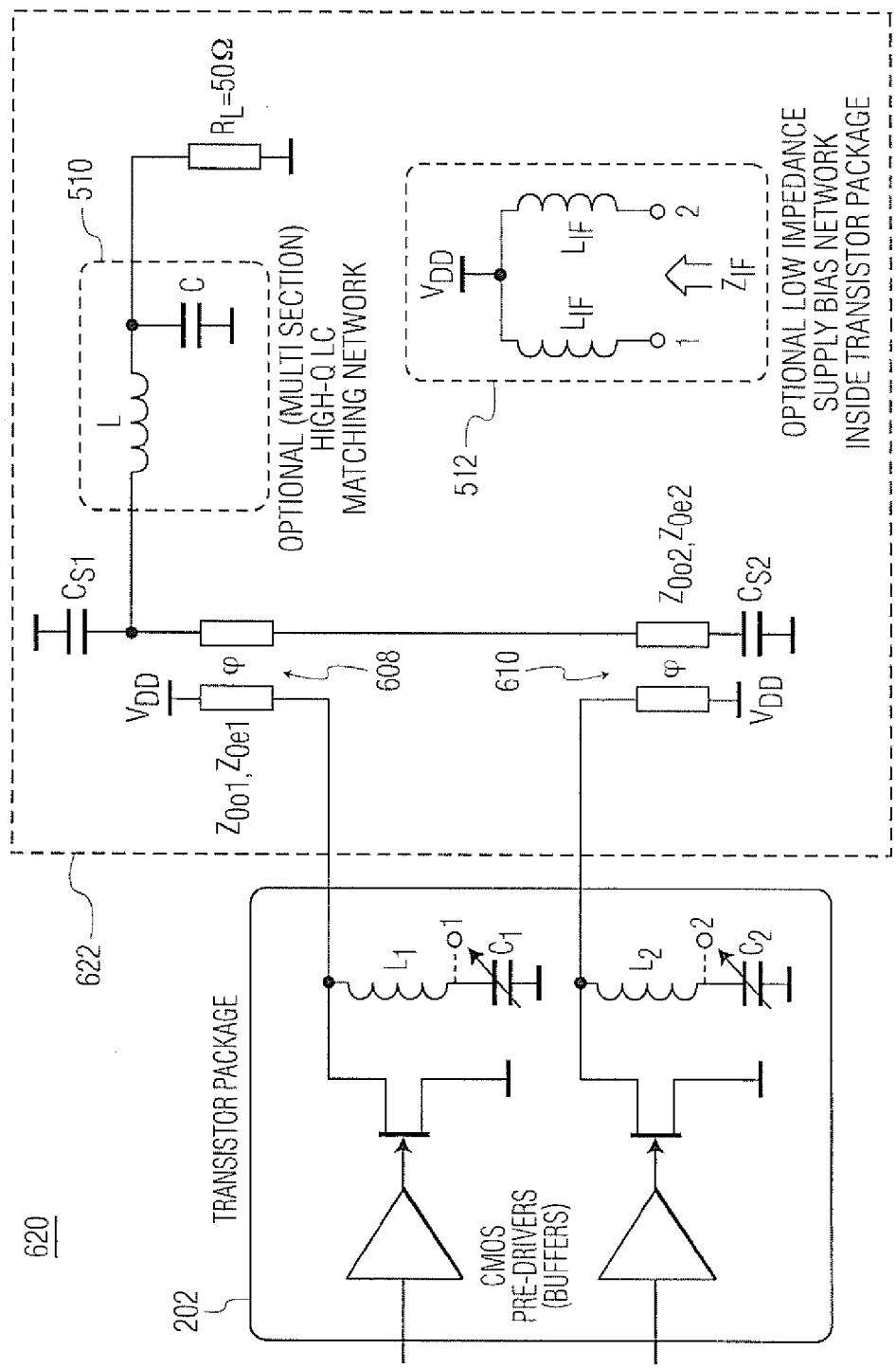

FIGS. 6A and 6B illustrate a schematic diagram of an out-phasing power amplifiers 600, 620 in accordance with another embodiment. In FIG. 6A, the power amplifier 600 may include the transistor circuit 202 and the broadband combiner 602, which may include coupled sections 604, 606. The transistor circuit 202 may include equivalent shunt series networks, where $L_1C_1=L_2C_2$. The combiner 602 may be similar to the combiner 502 (FIG. 5); however, a part of the Chireix compensation elements may be shifted into the combiner 602, thereby making it asymmetrical. The asymmetry may be achieved by making either the length of the coupled sections 604, 606 unequal, as illustrated in FIG. 6A. Alternatively, as shown in FIG. 6B, making the impedance of the coupled sections 608, 610 unequal in the combiner 622 may also achieve the asymmetry. In both the embodiments illustrated in FIGS. 6A and 6B, the class-E feed inductor of transistor circuit 202 may be preferably implemented by the shunt-series networks 210, 212 (FIG. 2) at the output. For re-configurability of the power amplifier, in accordance with various embodiments, it may be preferable that at least the class-E condition via the inductor be made tunable.

Figure 7:
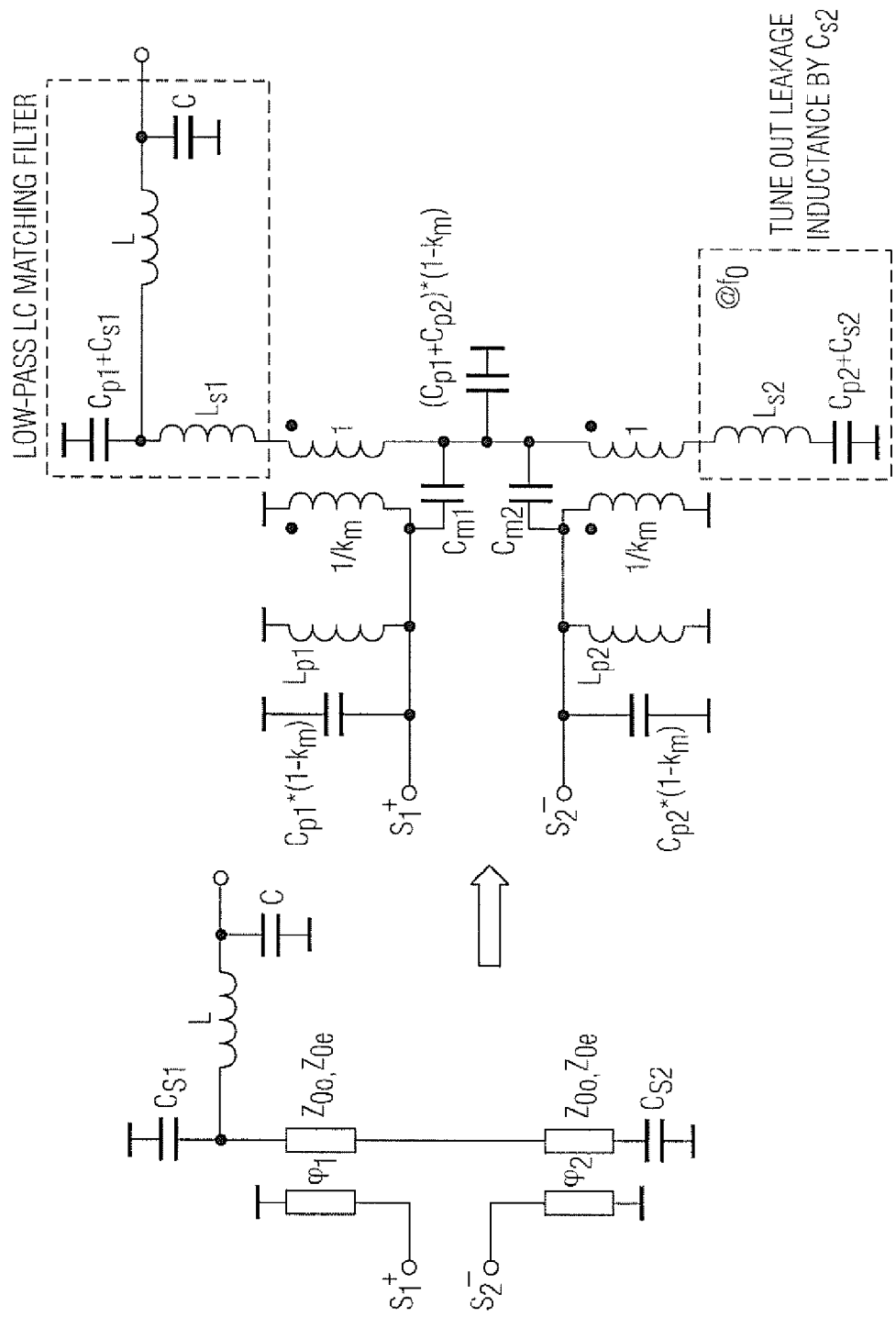
FIG. 7 shows a circuit schematic of an asymmetric Marchand balun with integrated Chireix elements for the power amplifier shown in FIG. 2.

FIG. 7 illustrates a circuit schematic 700 of an asymmetric Marchand balun with integrated Chireix elements. Circuit schematic 700 may be a lumped-element equivalent circuit schematic of a miniaturized Marchand balun. An advantage of this embodiment may be that the output parasitics ($L_{S1}$ and $C_{P1}$) may be absorbed inside the LC-matching network and the shunt input capacitance ($C_{P1,2} \cdot (1-k_m)$) may be absorbed in transistor output capacitance. More specifically, the parasitic shunt inductances and shunt capacitances at the input of the combiner may be incorporated in Chireix compensation and class-E shunt inductance elements. However, the leakage inductance of the lower coupled-line section ($\phi_2$) may have to be tuned out separately by $C_{S2}$. In some embodiments, the value of the leakage inductance $L_{S2}$ may be quite low (and also the resonator's quality factor) when there is sufficient coupling between the lines.

The relation between the coupled-line parameters (electrical length $\phi_{1,2}$, even and odd-mode characteristic impedances $Z_{0e}$, and $Z_{0o}$) and the lumped equivalent circuit may viewed according to the equations:

$$C_{m1,2} = \frac{Y_{0o} - Y_{0e}}{2\omega_0} \cdot \frac{1 - \cos(\varphi_{1,2})}{\sin(\varphi_{1,2})}$$

$$C_{p1,2} = \frac{Y_{0o} + Y_{0e}}{2\omega_0} \cdot \frac{1 - \cos(\varphi_{1,2})}{\sin(\varphi_{1,2})}$$

$$k_m = \frac{Y_{0o} - Y_{0e}}{Y_{0o} + Y_{0e}}$$

$$L_{S1,2} = L_{p1,2}(1 - k_m^2)$$

$$L_{p1,2} = \frac{z_{0e} + z_{0o}}{2\omega_0} \cdot \sin(\varphi_{1,2})$$

This may result in the effective input admittance at the input terminals $S_1$ and $S_2$ in becoming:

$$Y_{1,2} = \frac{1}{j\omega L_{p1,2}} + j\omega C_{p1,2}(1 - k_m^2) + k_m^2 Y_L(2\cos^2\theta \pm j\sin 2\theta) \quad (9)$$

Where the first two terms may be considered the effective shunt admittance of the balun. The third term may be considered the load modulation term and describes how the load impedance is modulated by the out-phasing angle $\theta$.

In one embodiment, when controlling the $L_1C_1$ and $L_2C_2$ shunt series, it may be desirable to have the effective shunt admittance of the balun $$\left( \frac{1}{j\omega L_{p1,2}} + j\omega C_{p1,2}(1 - k_m^2) \right)$$

be small enough to have no appreciable influence on the values set by $L_1C_1$ and $L_2C_2$. This may therefore result in the circuit schematic 700 being similar to the power amplifier 500, as illustrated in FIG. 5. The circuit schematic 700 may therefore also follow equations (5)-(8).

In another embodiment, the design of the circuit schematic 700 may be made in a piecemeal manner, separating the class-E and Chireix requirements and fulfilling them independently. In this manner, the Chireix compensation may be made by asymmetry in the balun, while the class-E requirement may be fulfilled by setting $L_1C_1=L_2C_2$, which may be similar to power amplifiers 600, 620 of FIGS. 6A-6B. In addition, the effective shunt admittance may also be small, as the value resulting from the asymmetry is of primary importance.

In another embodiment, when controlling the duty cycles of the power transistors, the use of the $L_1C_1$ and $L_2C_2$ shunt series networks may be ignored. Instead, the value of the effective shunt admittance $$\left( \frac{1}{j\omega L_{p1,2}} + j\omega C_{p1,2}(1 - k_m^2) \right)$$

may be set according to the class-E and Chireix requirements of equations (3) and (6) at the nominal design frequency.

Another alternative embodiment may also involve control of both the $L_1C_1$ and $L_2C_2$ shunt series networks in addition to the control of the power transistors' duty cycles. A person of ordinary skill in the art would be knowledgeable of methods to combine the above-described design techniques.

Figure 8A:
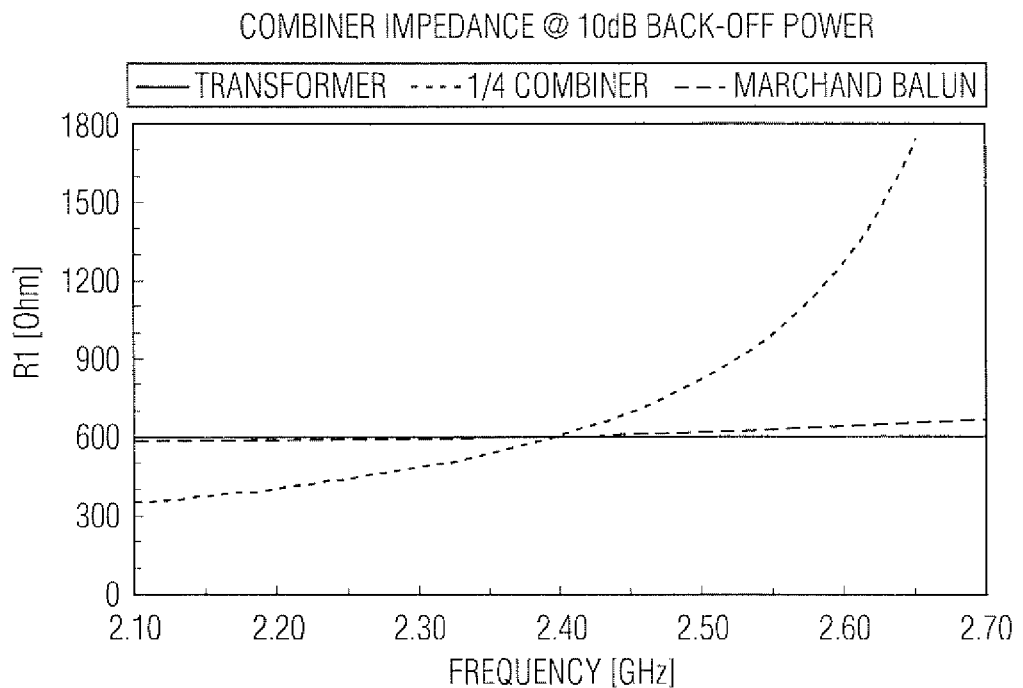
FIGS. 8A and 8B show input impedance versus frequency for an ideal transformer-based combiner, the quarter wavelength combiner shown in FIG. 1B, and the Marchand combiner shown in FIG. 7.
Figure 8B:
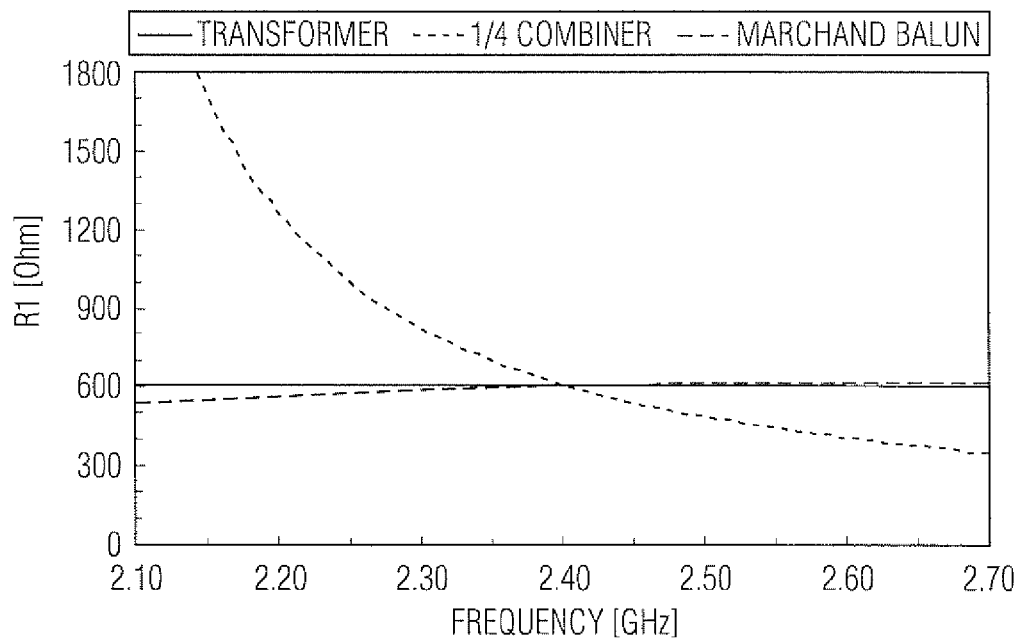

FIGS. 8A and 8B illustrate an example plot of input impedance versus frequency for an ideal transformer-based combiner, the quarter wavelength combiner of FIG. 1, and the Marchand combiner of FIG. 7.

In the exemplary plots shown in FIGS. 8A and 8B, the shunt resistance at 10 dB back-off (R=10·$R_{opt}$) is plotted versus frequency and is constant for an ideal transformer-based combiner and almost constant for the miniaturized Marchand combiner. As the input port impedance levels are about 10 times higher at 10 dB back-off power, the impedance transformation Q from the output to the input may also be approximately 10 times higher. This may cause an increased change in impedance level versus frequency, which may be considered a good design factor.

Figure 9:
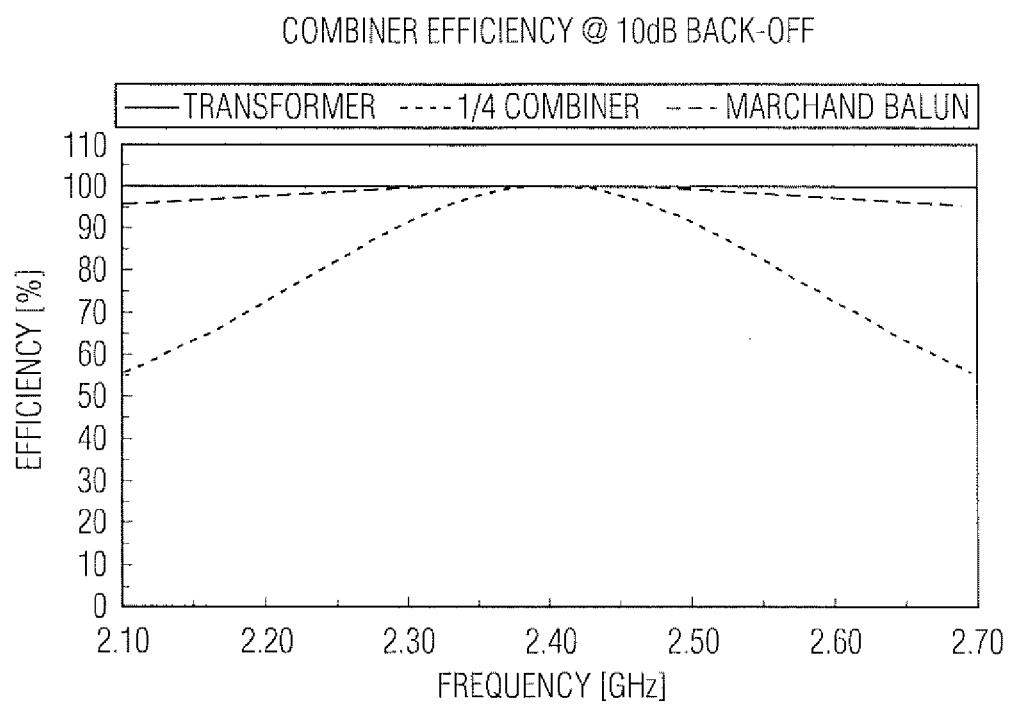
FIG. 9 shows Chireix combiner efficiency versus frequency for an ideal transformer-based combiner, the quarter wavelength combiner shown in FIG. 1B, and the Marchand combiner shown in FIG. 7.

The classical Chireix combiner with λ/4 transmission lines (or any derivative thereof) may suffer from highly frequency-dependent behavior of the port impedances at large back-off power levels. This may also be reflected in the PA power efficiency at 10 dB back-off power that is shown in the plot, as illustrated in FIG. 9. As can be seen from the exemplary plot, the efficiency of the transformer-based combiners or the miniaturized Marchand combiner are both almost 100% over a 25% bandwidth (2.1-2.7 GHz), covering many telecommunication standards (UMTS, WiMax, LTE), while the efficiency of the λ/4 transmission-line based combiner is limited in frequency. For the plots shown in FIGS. 8A, 8B, and 9, the reactive part of the shunt series resonator may be reconfigured to maintain the class-E and Chireix compensation requirement over the RF frequency band of interest.

Figure 10:
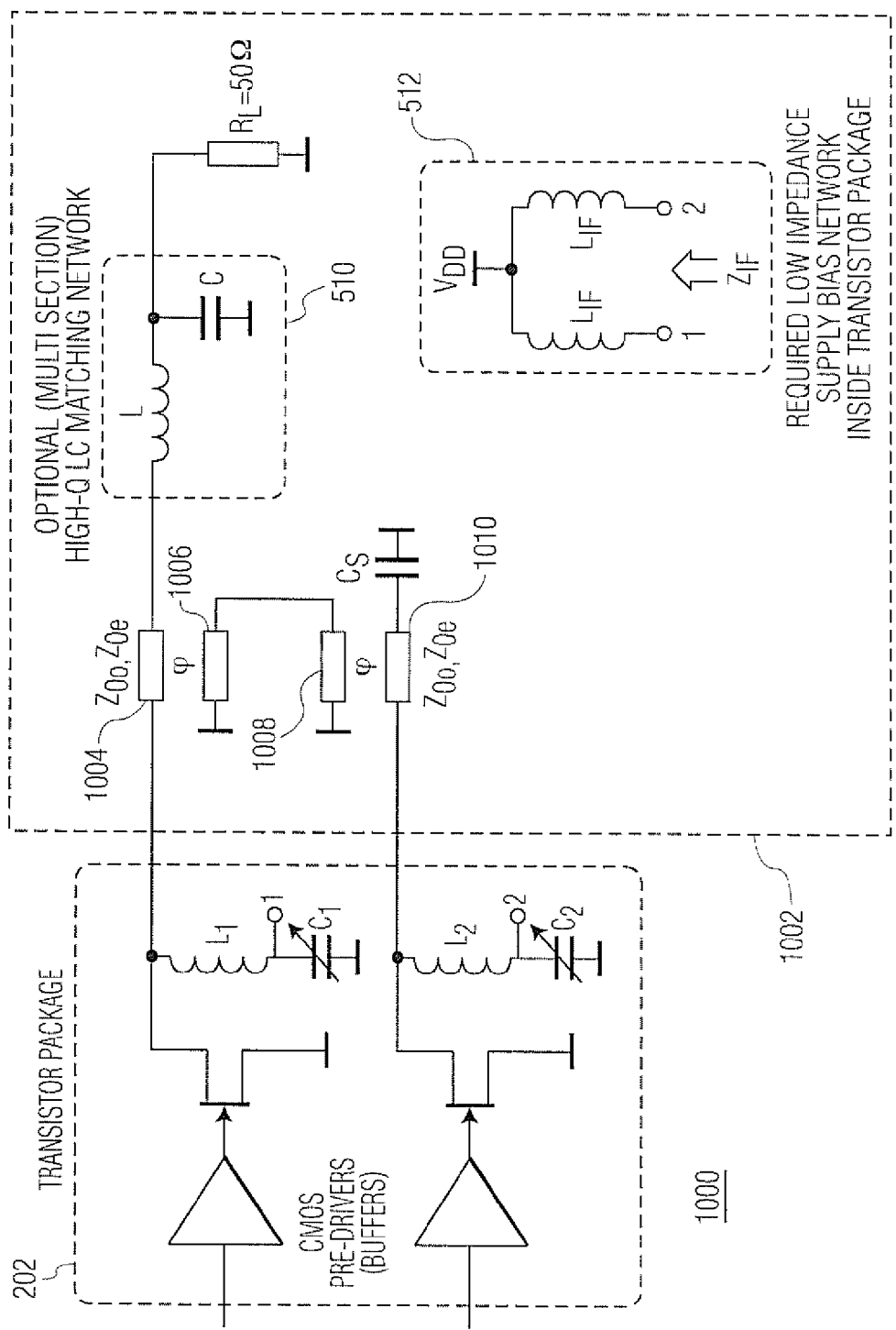
FIG. 10 shows a schematic diagram of an out-phasing power amplifier with variable shunt inductor, a broadband combiner, and a matching network in accordance with an embodiment.
Figure 11:
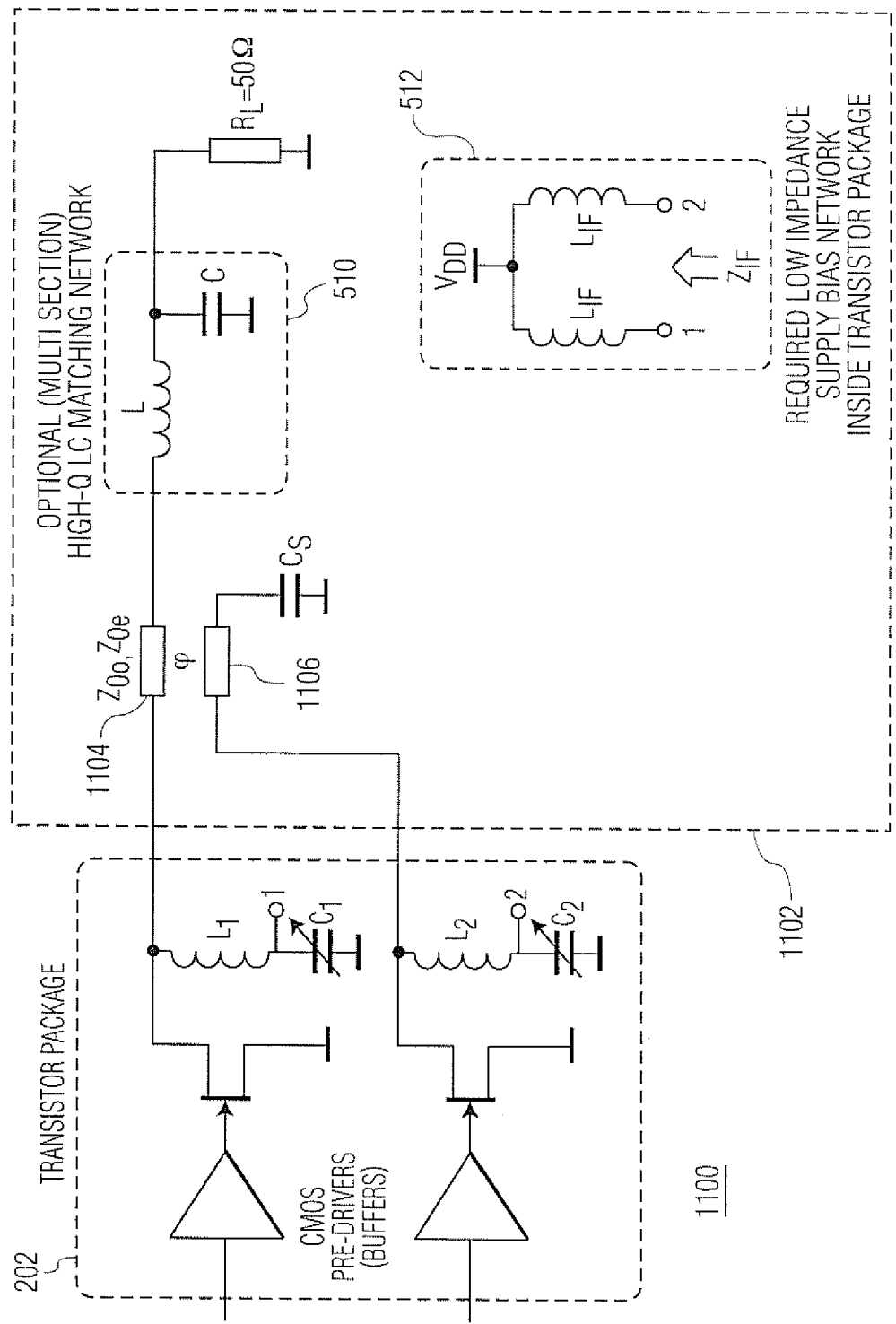
FIG. 11 shows a schematic diagram of an out-phasing power amplifier with variable shunt inductor, a broadband combiner, and a matching network in accordance with an embodiment.

FIGS. 10 and 11 illustrate schematics of an out-phasing power amplifier in accordance with other embodiments and based on transmission-line transformers. FIG. 10 illustrates a power amplifier 1000 having a transistor circuit 202 and broadband combiner circuit 1002 which includes transmission line elements 1004-1010. The combiner 1002 may also includes an LC-matching network 510 and an optional low-impedance-matching network 512. As noted above, the low-impedance-matching network 512 (e.g., low-pass LC filter) may be added at the output of the combiner 1002 to give additional impedance matching and set the desired loaded quality factor for the class-E operation. The electrical length of the transmission line ($\phi$) may set the desired shunt inductance for class-E operation and Chireix compensation, together with the varactor setting (as described in connection with FIG. 2). The series capacitance $C_S$ may be used to tune out the leakage inductance resulting from non-ideal magnetic coupling. The leakage inductance of the upper transmission line combiner may be shifted into the output matching network.

FIG. 11 illustrates a power amplifier 1100 including a broadband combiner 1102 having single transmission line, while FIG. 10 illustrates a broadband combiner with plural transmission lines.

Figure 12A:
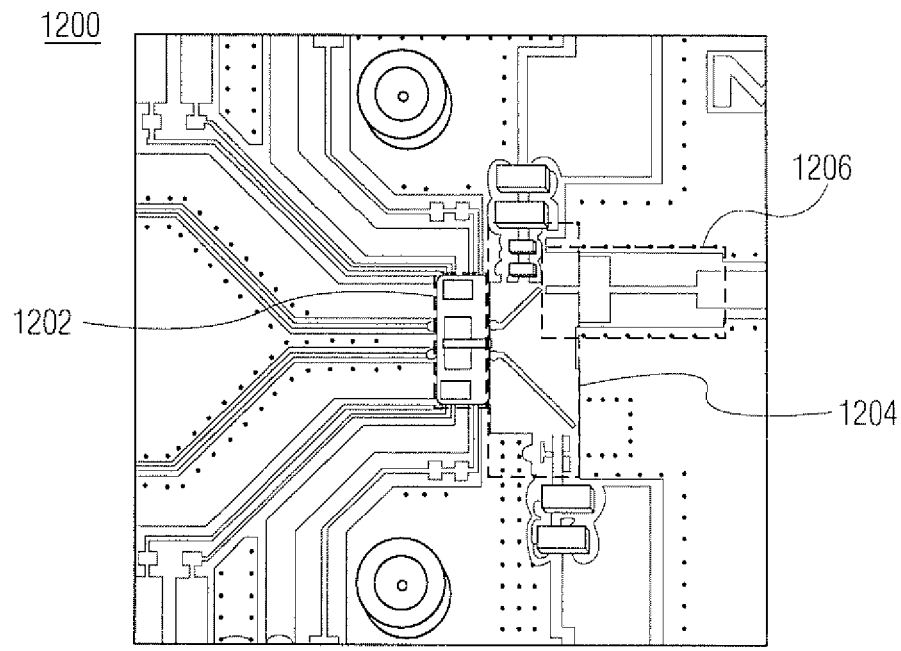
FIG. 12 shows practical implementation of the power amplifier shown in FIGS. 6A and 6B.
Figure 12B:
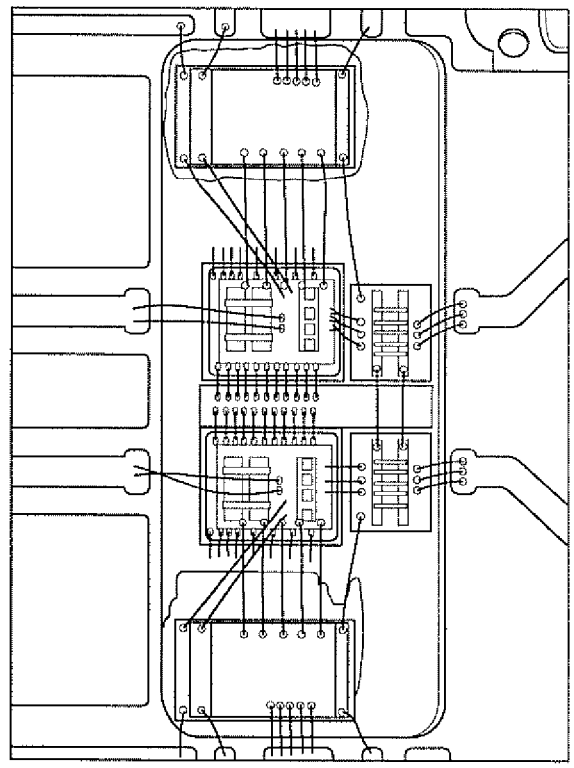
Figure 13:
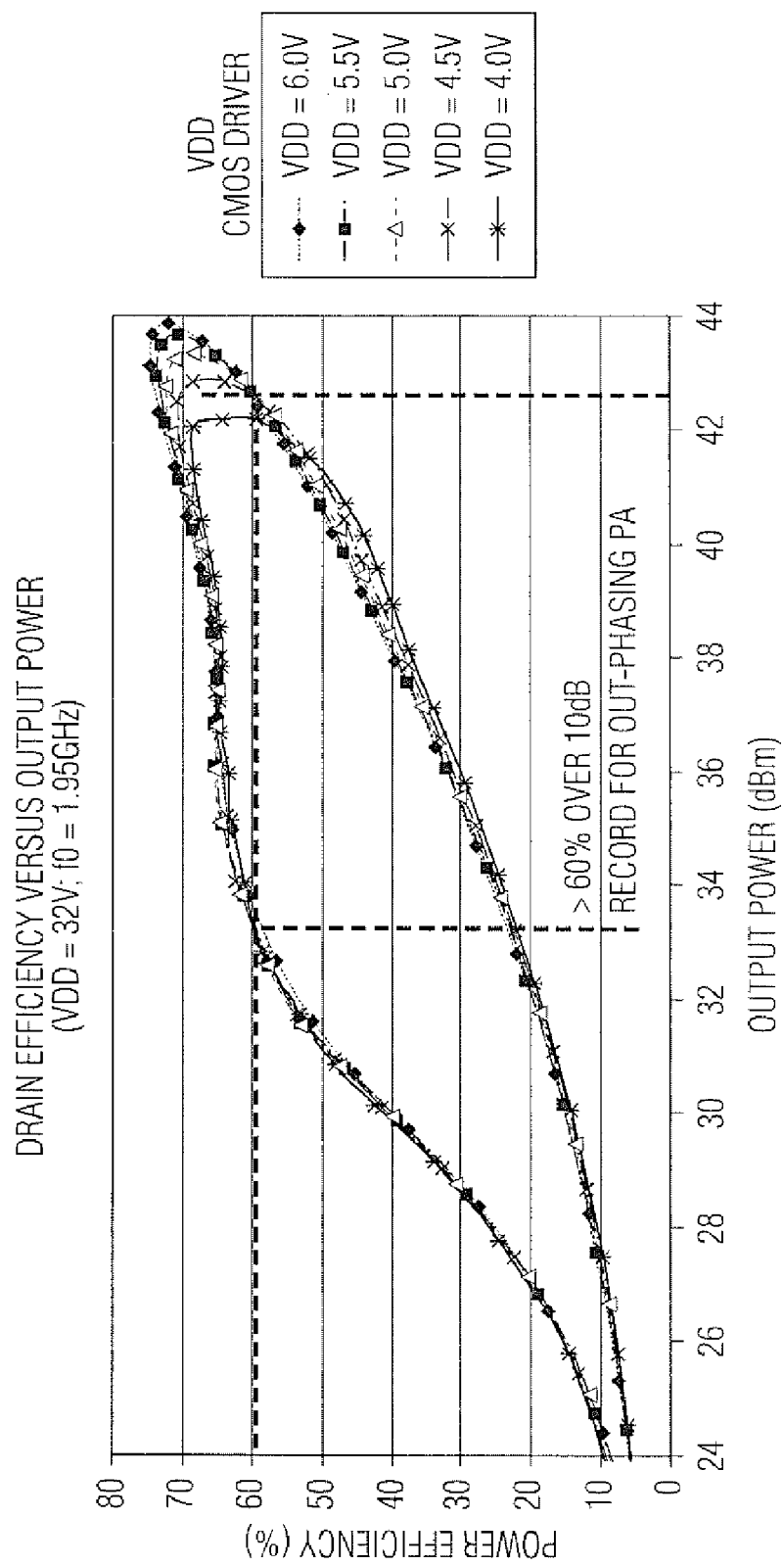
FIG. 13 illustrates drain efficiency versus output power of the power amplifier shown in FIG. 12 and implemented as a CMOS-GaN class-E out-phasing power amplifier.

FIGS. 12A and 12B illustrate practical implementation of the power amplifier shown in FIG. 6A, with a fixed $C_1$ and $C_2$ and resulting in a power amplifier efficiency performance of 60% at 10 dB back-off output power, which is shown in FIG. 13. FIG. 12 illustrates a circuit board 1200 having implemented transistor circuit package 1202, broadband combiner 1204, and LC-matching circuit 1206.

Figure 14:
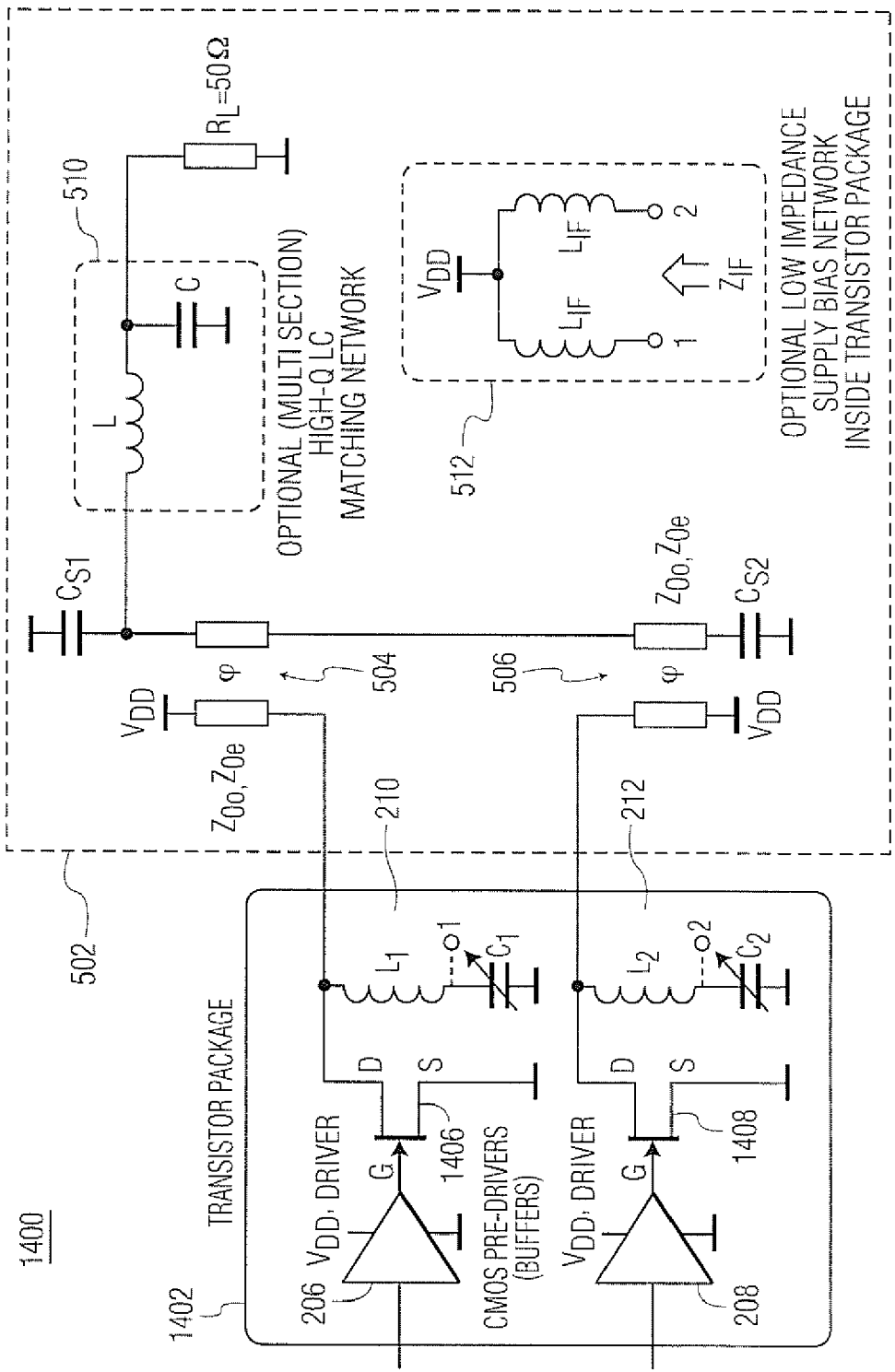
FIG. 14 shows a schematic diagram of an out-phasing power amplifier with variable shunt inductor, a broadband combiner, and a matching network in accordance with an embodiment.

FIG. 14 shows a schematic diagram of an out-phasing power amplifier with variable shunt inductor, a broadband combiner, and a matching network in accordance with an embodiment. Out-phasing power amplifier 1400 is similar to power amplifier 500, including a transistor circuit 1402 similar to the transistor circuit 202 and a broadband combiner circuit 502. Transistor circuit 1402 may include pre-driver components 206, 208, power transistors 1406, 1408, and shunt inductance circuitry 210, 212.

In some embodiments, the power transistors 1406, 1408 may include a parasitic gate-source capacitance (not shown) that may significantly and negatively affect the efficiency of the out-phasing power amplifier 1400 when producing lower power outputs. This may especially occur when the supply voltage used to power the pre-driver components 206, 208 remains high in order to supply a maximum peak voltage when required. For example, a supply voltage ($V_{DD, Driver}$) of 5 V may supply the pre-driver components 206, 208 to produce an output power ($P_{out}$) of 38 dBm, while the supply voltage ($V_{DD}$) of the power transistors 1406 and 1408 is 28V. However, when the output power is only 30 dBm, the supply voltage of 5 V may significantly decrease the overall efficiency of the power amplifier 1400, which may in part be due to the gate-source capacitances of power transistors 1406, 1408.

Therefore, in some embodiments, the pre-driver components 206, 208 may therefore receive a variable supply voltage $V_{DD,Driver}$ in order to maintain high efficiencies at power back-off levels. In such instances, the variable supply voltage may be a function of the out-phasing angle θ (i.e., $V_{DD,Driver}=f(\theta)$). The variable supply voltage $V_{DD,Driver}$ may be modulated in conjunction with a tunable balun or tunable duty cycle.

Figure 15:
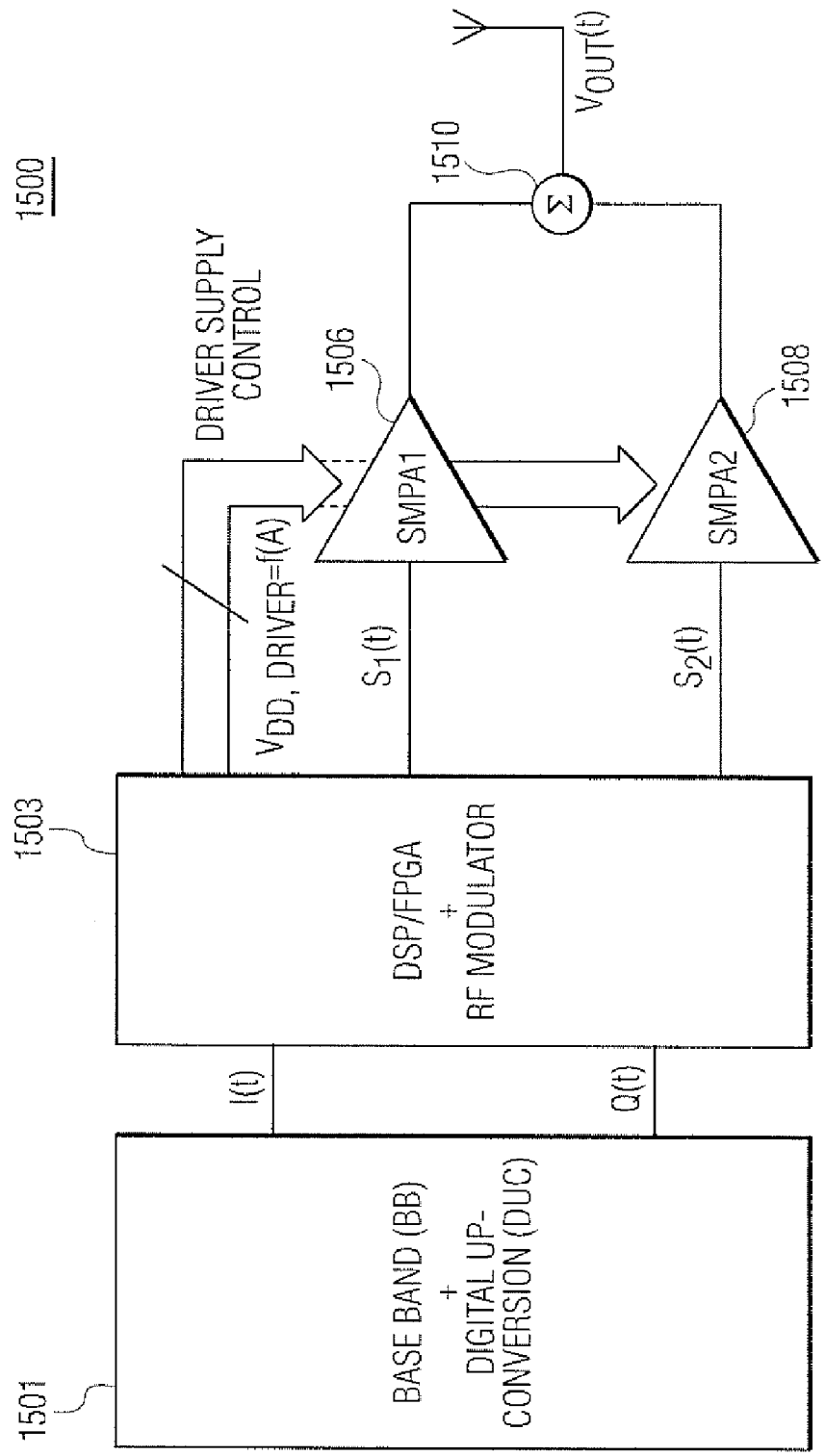
FIG. 15 shows a schematic diagram of an out-phasing power amplifier with variable supply voltage, variable shunt inductor, a broadband combiner, and a matching network in accordance with an embodiment.

FIG. 15 shows a schematic diagram of an out-phasing power amplifier with variable supply voltage ($V_{DD, Driver}$), variable shunt inductor, a broadband combiner, and a matching network in accordance with an embodiment. Similar in function to the out-phasing amplifier 1400 of FIG. 14, the out-phasing power amplifier 1500 includes a first block 1501, a second block 1503, switch-mode power amplifiers 1506, 1508, and a combiner 1510. In some embodiments, the first and second blocks 1501, 1503 may be used to produce the variable supply voltage $V_{DD,Driver}$ to the power amplifiers 1506, 1508, whose output may be combined by the combiner 1510 to produce an output power based on the output voltage $v_{out}$. In the illustrative embodiment, the first block 1501 may include a base band (BB) and a digital up-conversion (DUC) circuit, while the second block 1503 may include a digital signal processor (DSP) or field-programmable gate array (FPGA) and a radio-frequency (RF) modulator.

First block 1501 may comprise a base band and a digital up-conversion circuit that provides a series of in-phase (I) and quadrature-phase (Q) pairs based upon the base band. Each of the (I, Q) pairs may correspond to a in-phase value I(t) for the base band at time t, while also corresponding for a quadrature-phase value Q(t) for time t that is 90 degrees out of phase with the original base band.

Second block 1503 may comprise a digital signal processor or field-programmable gate array and RF modulator. Second block 1503 may provide the variable supply voltage $V_{DD}$ based on the (I(t), Q(t)) value pairs received from the first block 1501. In some embodiments, the DSP or FPGA in the second block 1503 may produce a phase-modulated signal to serve as an input for the power amplifiers 1506, 1508, and a baseband envelope for the signal produced by the power amplifiers 1506, 1508. The phase-modulated signal may be expressed as:

$$A\cos(\phi(t)) \text{ where } A(t)=\sqrt{I^2(t)+Q^2(t)}$$

$$\phi(t)=\arctan(Q(t)/I(t))$$

In some embodiments, the variable supply voltage $V_{DD}$ may be based on A. As a result, the variable supply voltage may be based on the (I, Q) pairs as produced by the first block 1501.

In some embodiments, the second block 1503 may also include an RF modulator that may use the phase-modulated signals to produce one or more constant-amplitude phase-modulated signals for the power amplifiers 1506, 1508. For example, the RF modulator may produce two signals for the power amplifiers 1506, 1508:

$$S_1(t)=\text{sgn}[\cos(\omega_c t+\phi(t)+\theta(t))]$$

$$S_2(t)=\text{sgn}[\cos(\omega_c t+\phi(t)-\theta(t))]$$

where sgn is a sign function and wc is the RF carrier frequency. As a result, each of the power amplifiers may receive a square wave from the second block 1503 and may alternately produce a positive or negative constant value multiplied by their gain.

At the output of the combiner 1510, the out-phasing amplifier 1500 may produce and output power based on a signal that is the combination of the outputs of the power amplifiers 1506, 1508. In some embodiments, the output power may be based on A, such as when the power amplifiers 1506, 1508 possess the same gain G. For example, as $P_{out}$ is proportional to $v_{out}$, the output power may be a function of A according to the equation:

$$v_{out}(t) = $$
$$(S_1(t)+S_2(t)) = G\cdot 2\cos(\theta(t))\cdot\cos(\omega_c t+\varphi(t)) = G\cdot A(t)\cdot\cos(\omega_c t+\varphi(t))$$

As a result of this relationship, when the momentary power at the output is low in this example (i.e., A(t) is low), less power is necessary from the out-phasing power amplifier 1500 to drive into saturation. As a result, less of the variable supply voltage $V_{DD,Driver}$ is required to reach the desired output level. Thus, at lower outputs, $V_{DD,Driver}$ may be lowered. As will be shown in FIGS. 17A-B, the lower supply voltages result in a rise in efficiency at lower power output levels. This may be clue, for example, to a lower gate-source capacitance at the power transistors 1406, 1408.

Figure 16:
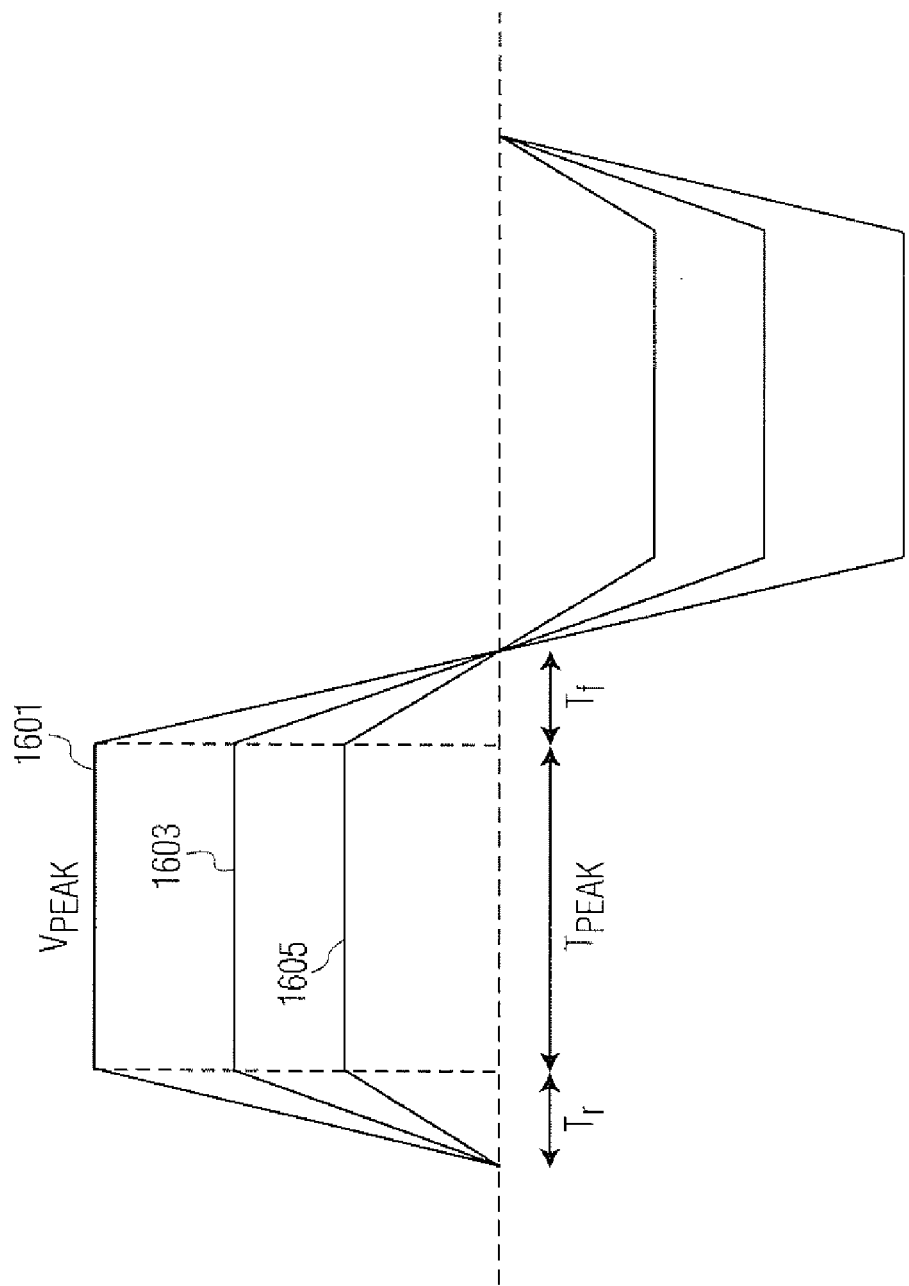
FIG. 16 illustrates an exemplary voltage signal produced by the exemplary pre-driver of the power amplifier with a variable peak voltage.

FIG. 16 illustrates an exemplary voltage signal produced by the exemplary pre-driver of the power amplifier with a variable peak voltage. FIG. 16 illustrates three voltage signals 1601, 1603, 1605 at the output of pre-drivers 206, 208 that are modified by a supply voltage $V_{DD,Driver}$ used on the pre-drivers 206, 208. In the illustrative embodiment, the voltage signals 1601-1605 may be non-ideal square waves, with a non-zero rising period $T_r$ and/or falling period $T_f$ in addition to the peak period $T_{peak}$ when a supply voltage $V_{DD,Driver}$ is used on the pre-drivers 206, 208. The differences in $V_{peak}$ in the voltage signals 1601-1605 may be the result of supply modulation, with the out-phasing angle-dependent supply voltage enabling the pre-drivers 206, 208 to only produce higher-voltage signals such as 1601 only when provided a higher supply voltage $V_{DD,Driver}$.

Figure 17A:
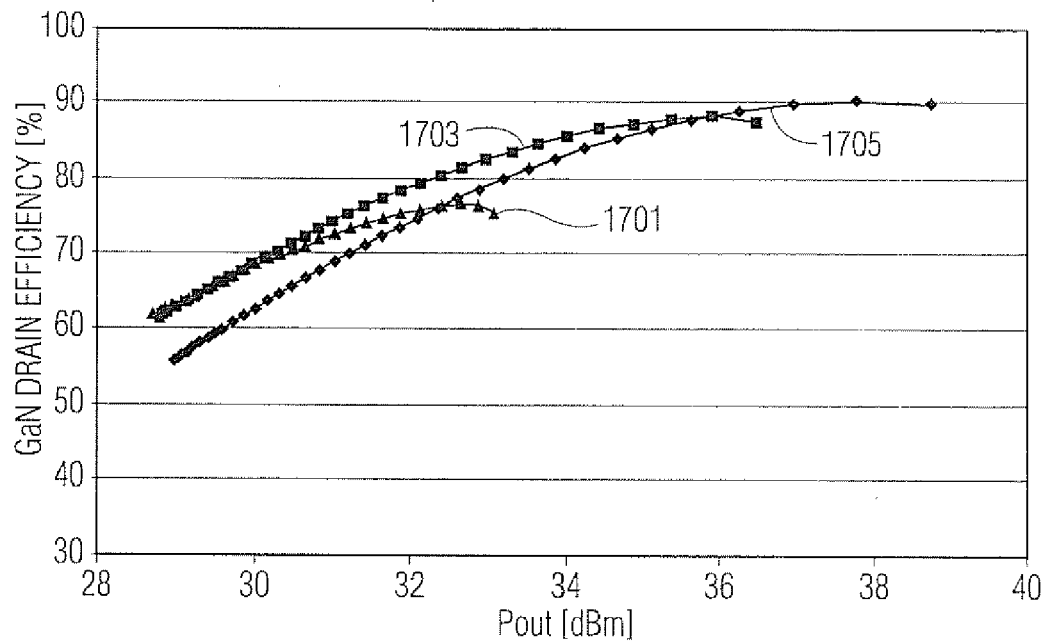
FIG. 17A shows drain efficiency versus output power shown for the out-phasing power amplifier shown in FIG. 14.

FIG. 17A shows drain efficiency versus output power shown for the out-phasing power amplifier shown in FIG. 14. As shown in the graph, the GaN power transistor drain efficiency is lower for higher supply voltages within defined power output ranges. For example, in the illustrative embodiment, line 1701 graphs drain efficiency for a $V_{DD,Driver}$=2.5 V, while lines 1703 and 1705 represent efficiencies for supply voltages of 3.5 V and 5 V, respectively. As the graph illustrates, the drain efficiency is lowest with the highest supply voltages at low power output ranges. However, higher supply voltages are necessary to enable high efficiency for higher power output levels or to even supply enough power. For example, the graph illustrates that $V_{DD,Driver}$ of 3.5 V is preferred to supply an output power of 34 dBm, while a $V_{DD,Driver}$ of 5 V is necessary to provide output power above 37 dBm.

Figure 17B:
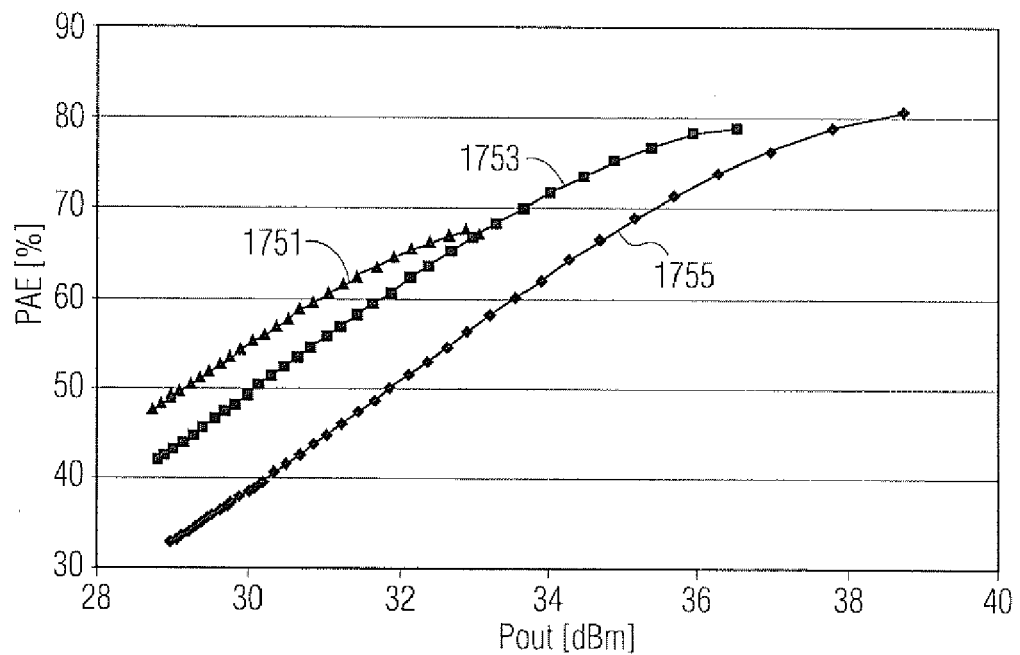
FIG. 17B shows power amplifier efficiency (PAE) versus output power shown for the out-phasing power amplifier shown in FIG. 14.

FIG. 17B shows power amplifier efficiency (PAE) versus output power shown for the out-phasing power amplifier shown in FIG. 14. The illustrated graph also shows through efficiency lines 1751, 1753, 1755 the comparative power efficiencies of the out-phasing power amplifier 1400 for different supply voltages $V_{DD,Driver}$. For example, line 1751 illustrates that the lower $V_{DD,Driver}$ of 2.5 V is most efficient to produce output power levels of 25-33 dBm, while 3.5 V is most efficient to produce output power between 33-36 dBm. A higher $V_{DD,Driver}$ of 5 V may be necessary to produce sufficient output power when the desired power level is above 36 dBm.

Applications of the various embodiments include (reconfigurable) transmitters for connectivity and cellular applications, where the modulation standards with high peak-to-average ratio (PAR) require the power amplifier to be efficient over a large dynamic range. These transmitters are desirable for systems in which wide-band complex envelope signals are processed, such as, for example, EDGE, UMTS (WCDMA), HSxPA, WiMAX (OFDM) and 3G-LTE (OFDM).

It should be apparent from the foregoing description that various exemplary embodiments may be implemented in hardware and/or firmware.

Although the various exemplary embodiments have been described in detail with particular reference to certain exemplary aspects thereof, it should be understood that other embodiments and its details are capable of modifications in various obvious respects. As is readily apparent to those skilled in the art, variations and modifications can be affected while remaining within the spirit and scope of the embodiments. Accordingly, the foregoing disclosure, description, and figures are for illustrative purposes only and do not in any way limit the embodiments described, which is defined only by the claims.

We claim:

1. An integrated digital Chireix power amplifier device comprising:
    a power transistor circuit comprising:
        a plurality of power transistors receiving a variable supply voltage, and
        a shunt-series circuit, wherein the power transistor circuit produces an output power proportional to the variable supply voltage;
    a broadband combiner having Chireix compensation elements, wherein variable capacitors in the broadband combiner enable reconfiguring of the power amplifier device; and
    an impedance matching filter, wherein the power transistor circuit, the broadband combiner, and the impedance matching filter are integrated in a unified package.

2. An integrated digital Chireix power amplifier device comprising:
    a power transistor circuit comprising:
        a plurality of power transistors receiving a variable supply voltage, and
        a shunt-series circuit, wherein the power transistor circuit produces an output power proportional to the variable supply voltage;
    a broadband combiner having Chireix compensation elements; and
    an impedance matching filter, wherein the power transistor circuit, the broadband combiner, and the impedance matching filter are integrated in a unified package,
    wherein the broadband combiner comprises a fixed broadband network and the power amplifier device can be reconfigured for different frequency bands by adjusting a duty cycle of at least one of the plurality of power transistors.

3. The power amplifier device of claim 1, wherein the broadband combiner further comprises:
    a Marchand balun having a phase angle of less than 90 degrees.

4. The power amplifier device of claim 3, wherein the broadband combiner is configured to provide a constant real impedance level across a bandwidth of interest, and a low-pass LC filter is provided at an output node of the broadband combiner to provide additional impedance matching and quality factors for a class-E operation of the power amplifier device.

5. The power amplifier device of claim 1, wherein the variable supply voltage is produced by a pre-driver and comprises a square wave signal with a variable peak voltage ($V_{peak}$).

6. The power amplifier device of claim 5, wherein the variable supply voltage is produced by a pre-driver and includes a non-zero rising period ($t_r$) and falling period ($t_f$), wherein a sum of the rising period and the falling period is less than 20% of a peak voltage period ($t_{peak}$).

7. An integrated digital Chireix power amplifier device comprising:
    a power transistor circuit comprising;
        a plurality of power transistors receiving a variable supply voltage, and
        a shunt-series circuit, wherein the power transistor circuit produces an output power proportional to the variable supply voltage;
    a broadband combiner having Chireix compensation elements;
    an impedance matching filter, wherein the power transistor circuit, the broadband combiner, and the impedance matching filter are integrated in a unified package; and
    an input circuit that provides the variable supply voltage to the plurality of power transistors, the input circuit comprising:
        a digital signal processor (DSP) that receives pairs of in-phase (I) and quadrature phase (Q) signals and produces a baseband envelope (A) for the variable supply voltage based on the (I, Q) values.

8. The power amplifier device of claim 7, wherein the input circuit further comprises:
a first block that provides the (I, Q) values comprising:
a base band (BB) circuit, and
a digital up-conversion (DUC) circuit.

9. The power amplifier device of claim 7, wherein the input circuit further comprises:
a Radio Frequency (RF) modulator that receives a phase-modulated signal produced by the DSP and produces constant-amplitude phase-modulated signals for the plurality of power transistors.

10. The power amplifier device of claim 7, wherein the plurality of power transistors have a gain (G), and the power transistor circuit produces an output voltage ($v_{out}$) according to the equation:

$$v_{out}=GA\cdot\cos(\phi(t)+\omega_c t).$$

11. A method of driving an integrated Chireix power amplifier device, the method comprising:
providing a power transistor circuit comprising a plurality of power transistors receiving a variable supply voltage and a shunt-series circuit, a broadband combiner having Chireix compensation elements, and an impedance matching filter in a unified package;
driving variable capacitors in the broadband combiner so as to enable reconfiguring of the power amplifier device; and
producing, by the power transistor circuit, an output power proportional to the variable supply voltage.

12. The method of claim 11, further comprising:
reconfiguring the broadband combiner for operation at different frequency bands by adjusting a duty cycle of at least one of the plurality of power transistors, wherein the broadband combiner comprises a fixed broadband network.

13. The method of claim 11, wherein the broadband combiner comprises a Marchand balun having a phase angle of less than 90 degrees.

14. The method of claim 13, further comprising:
providing a constant real impedance level across a bandwidth of interest; and
providing a low-pass LC filter at an output node of the broadband combiner, wherein the low-pass LC filter provides additional impedance matching, and establishes quality factors for a class-E operation of the power amplifier device.

15. The method of claim 11, wherein the variable supply voltage comprises a square wave signal with a variable peak voltage ($V_{peak}$).

16. The method of claim 15, wherein the variable supply voltage includes a non-zero rising period ($t_r$) and falling period ($t_f$), wherein a sum of the rising period and the falling period is less than 20% of a peak voltage period ($t_{peak}$).

17. The method of claim 11, further comprising:
receiving, by a digital signal processor (DSP) in an input circuit, pairs of in-phase (I) and quadrature-phase (Q) signals; and
producing, by the DSP, a baseband envelope (A) for the variable supply voltage based on the (I, Q) values; and
providing, by the input circuit, the variable supply voltage to the plurality of power transistors.

18. The method of claim 17, further comprising:
providing, by a first block in the input circuit comprising a base band (BB) circuit and a digital up-conversion (DUC) circuit, the (I, Q) values.

19. The method of claim 17, further comprising:
receiving, by a Radio Freauency (RF) modulator in the input circuit, a phase-modulated signal produced by the DSP; and
producing, by the RF modulator, constant-amplitude phase-modulated signals for the plurality of power transistors.

20. The method of claim 19, wherein the plurality of power transistors have a gain (G), and the power transistor circuit produces an output voltage ($v_{out}$) according to the equation:

$$v_{out}=GA\cdot\cos(\phi(t)+\omega_c t).$$

* * * * *